United States Patent
Cornwell et al.

(10) Patent No.: US 8,000,134 B2
(45) Date of Patent: *Aug. 16, 2011

(54) OFF-DIE CHARGE PUMP THAT SUPPLIES MULTIPLE FLASH DEVICES

(75) Inventors: Michael J. Cornwell, San Jose, CA (US); Christopher P. Dudte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 815 days.

This patent is subject to a terminal disclaimer.

(21) Appl. No.: 11/694,799

(22) Filed: Mar. 30, 2007

(65) Prior Publication Data

US 2007/0263442 A1    Nov. 15, 2007

Related U.S. Application Data

(60) Provisional application No. 60/800,357, filed on May 15, 2006.

(51) Int. Cl.
*G11C 16/04* (2006.01)

(52) U.S. Cl. .......... 365/185.03; 365/185.17; 365/185.18

(58) Field of Classification Search ............. 365/185.03, 365/185.08, 185.09, 185.33, 185.2, 185.17, 365/185.18

See application file for complete search history.

(56) References Cited

U.S. PATENT DOCUMENTS

| | | | |
|---|---|---|---|
| 5,023,646 A | 6/1991 | Ishida et al. |
| 5,109,496 A | 4/1992 | Beausoleil et al. |
| 5,394,450 A | 2/1995 | Pasternak |
| 5,412,601 A | 5/1995 | Sawada et al. |
| 5,424,978 A | 6/1995 | Wada et al. |
| 5,515,321 A | 5/1996 | Hazama |
| 5,541,883 A | 7/1996 | Devanney |
| 5,541,886 A | 7/1996 | Hasbun |
| 5,602,987 A | 2/1997 | Harari et al. |
| 5,671,229 A | 9/1997 | Harari et al. |
| 5,712,815 A | 1/1998 | Bill et al. |
| 5,719,808 A | 2/1998 | Harari et al. |
| 5,745,414 A | 4/1998 | Engh et al. |
| 5,801,980 A | 9/1998 | Wong et al. |
| 5,812,814 A | 9/1998 | Sukegawa |
| 5,867,721 A | 2/1999 | Leinwander et al. |
| 5,870,041 A | 2/1999 | Lee et al. |

(Continued)

FOREIGN PATENT DOCUMENTS

EP    0801398    10/1997

(Continued)

OTHER PUBLICATIONS

Inoue, et al. "NAND Flash Applications Design Guide: System Solutions from Toshiba America Electronic Components, Inc." Apr. 2003, pp. 1-29.

(Continued)

*Primary Examiner* — VanThu Nguyen
*Assistant Examiner* — Hien N Nguyen
(74) *Attorney, Agent, or Firm* — Fish & Richardson P.C.

(57) ABSTRACT

A system and method for storing data uses multiple flash memory dies. Each flash memory die includes multiple flash memory cells. A charge pump is adapted to supply charge at a predetermined voltage to each flash memory die of the flash memory dies, and an interface is adapted to receive instructions for controlling the charge pump.

15 Claims, 17 Drawing Sheets

U.S. PATENT DOCUMENTS

| | | | |
|---|---|---|---|
| 5,910,924 A | 6/1999 | Tanaka et al. | |
| 5,946,714 A | 8/1999 | Miyauchi | |
| 6,023,781 A | 2/2000 | Hazama | |
| 6,058,060 A | 5/2000 | Wong | |
| 6,072,676 A * | 6/2000 | Tran et al. | 361/56 |
| 6,081,447 A | 6/2000 | Lofgren et al. | |
| 6,097,638 A | 8/2000 | Himeno et al. | |
| 6,134,141 A | 10/2000 | Wong | |
| 6,141,492 A | 10/2000 | Hori | |
| 6,149,316 A | 11/2000 | Harari et al. | |
| 6,166,960 A * | 12/2000 | Marneweck et al. | 365/185.28 |
| 6,184,726 B1 | 2/2001 | Haeberli et al. | |
| 6,243,290 B1 | 6/2001 | Kurata et al. | |
| 6,259,627 B1 | 7/2001 | Wong | |
| 6,313,493 B1 | 11/2001 | Mori et al. | |
| 6,424,569 B1 | 7/2002 | Parker et al. | |
| 6,424,748 B1 | 7/2002 | Ting-Shan | |
| 6,426,893 B1 | 7/2002 | Conley et al. | |
| 6,552,929 B1 | 4/2003 | Parker | |
| 6,711,059 B2 | 3/2004 | Sinclair et al. | |
| 6,721,820 B2 | 4/2004 | Zilberman et al. | |
| 6,757,842 B2 | 6/2004 | Harari et al. | |
| 6,763,424 B2 | 7/2004 | Conley | |
| 6,831,858 B2 | 12/2004 | Hirano | |
| 6,856,546 B2 | 2/2005 | Guterman et al. | |
| 6,914,846 B2 | 7/2005 | Harari et al. | |
| 6,925,009 B2 | 8/2005 | Noguchi et al. | |
| 6,937,513 B1 | 8/2005 | Desai et al. | |
| 6,947,332 B2 | 9/2005 | Wallace et al. | |
| 6,963,505 B2 | 11/2005 | Cohen | |
| 7,006,379 B2 | 2/2006 | Noguchi et al. | |
| 7,016,231 B2 | 3/2006 | Kubo | |
| 7,088,615 B2 | 8/2006 | Guterman et al. | |
| 7,137,011 B1 | 11/2006 | Harari et al. | |
| 7,162,569 B2 | 1/2007 | Conley et al. | |
| 7,164,561 B2 | 1/2007 | Wang et al. | |
| 7,170,781 B2 | 1/2007 | So et al. | |
| 7,212,067 B2 | 5/2007 | Pasternak | |
| 7,218,570 B2 | 5/2007 | So et al. | |
| 7,237,046 B2 | 6/2007 | Paley et al. | |
| 7,237,074 B2 | 6/2007 | Guterman et al. | |
| 7,240,219 B2 | 7/2007 | Teicher et al. | |
| 7,274,602 B2 | 9/2007 | Arakawa | |
| 7,286,394 B2 | 10/2007 | Ooishi | |
| 7,304,883 B2 | 12/2007 | Sumita | |
| 7,317,630 B2 * | 1/2008 | Telecco et al. | 365/63 |
| 7,391,193 B2 | 6/2008 | Wang et al. | |
| 7,477,549 B2 | 1/2009 | Honda | |
| 2002/0021602 A1 | 2/2002 | Morishita | |
| 2002/0140463 A1 | 10/2002 | Cheung | |
| 2003/0086293 A1 | 5/2003 | Gongwer et al. | |
| 2003/0103398 A1 | 6/2003 | Van Tran | |
| 2003/0137877 A1 | 7/2003 | Mokhlesi et al. | |
| 2003/0217323 A1 | 11/2003 | Guterman et al. | |
| 2004/0042269 A1 | 3/2004 | Tamura et al. | |
| 2004/0114427 A1 | 6/2004 | Hamaguchi | |
| 2004/0145955 A1 | 7/2004 | Mizuno et al. | |
| 2004/0179397 A1 | 9/2004 | Banks | |
| 2004/0205290 A1 | 10/2004 | Shinagawa et al. | |
| 2005/0007801 A1 | 1/2005 | Barzilai et al. | |
| 2005/0024128 A1 | 2/2005 | Pasternak | |
| 2005/0027928 A1 | 2/2005 | Avraham et al. | |
| 2005/0052934 A1 | 3/2005 | Tran et al. | |
| 2005/0146919 A1 | 7/2005 | Ellis et al. | |
| 2005/0172207 A1 | 8/2005 | Radke et al. | |
| 2005/0179421 A1 | 8/2005 | Wang et al. | |
| 2005/0180209 A1 | 8/2005 | Lasser | |
| 2005/0242835 A1 | 11/2005 | Vadi et al. | |
| 2005/0246520 A1 | 11/2005 | Vadi et al. | |
| 2005/0248364 A1 | 11/2005 | Vadi et al. | |
| 2005/0262323 A1 | 11/2005 | Woo et al. | |
| 2005/0273548 A1 | 12/2005 | Roohparvar | |
| 2006/0101193 A1 | 5/2006 | Murin | |
| 2006/0164054 A1 | 7/2006 | Wang et al. | |
| 2006/0215454 A1 | 9/2006 | In et al. | |
| 2006/0294295 A1 | 12/2006 | Fukuzo | |
| 2007/0074093 A1 | 3/2007 | Lasser | |
| 2007/0091677 A1 | 4/2007 | Lasser et al. | |
| 2007/0220388 A1 | 9/2007 | Quereshi et al. | |
| 2007/0226434 A1 | 9/2007 | Guterman et al. | |
| 2008/0018377 A1 | 1/2008 | Chung | |

FOREIGN PATENT DOCUMENTS

| | | |
|---|---|---|
| EP | 0865046 | 9/1998 |
| EP | 1005213 | 5/2000 |
| EP | 1130602 | 9/2001 |
| EP | 1-182-669 | 2/2002 |
| EP | 1426971 | 6/2004 |
| EP | 1624461 | 2/2006 |
| JP | 55070986 | 5/1980 |
| KR | 10-2004-0044938 | 5/2004 |
| WO | WO93/22770 | 11/1993 |
| WO | WO98/10425 | 3/1998 |
| WO | WO01/63615 | 8/2001 |
| WO | WO02/067269 | 8/2002 |

OTHER PUBLICATIONS

International Search Report & Written Opinion, PCT/US2007/068699, mailed Feb. 8, 2008, 16 pages.
International Search Report & Written Opinion, PCT/US2007/068799, mailed Jan. 30, 2008, 14 pages.
International Search Report & Written Opinion, PCT/US2007/068802, Mailed Jan. 22, 2008, 17 pages.
International Search Report & Written Opinion, PCT/US2007/068810, mailed Jan. 22, 2008, 15 pages.
International Search Report & Written Opinion, PCT/US2007/068851, mailed Jun. 20, 2008, 26 pages.
International Search Report & Written Opinion, PCT/US2007/068903, mailed Jan. 22, 2008, 16 pages.
International Search Report & Written Opinion, PCT/US2007/068966, mailed Jun. 12, 2008, 29 pages.
International Search Report & Written Opinion, PCT/US2007/068950, mailed Jan. 16, 2008, 19 pages.
International Search Report & Written Opinion, PCT/US2007/068958, mailed Feb. 8, 2008, 17 pages.
International Search Report & Written Opinion, PCT/US2007/068859, mailed Jan. 22, 2008, 19 pages.
U.S. Appl. No. 11/694,693, filed Mar. 30, 2007, Non-final Office Action mailed Jul. 2, 2008, 9 pages.
U.S. Appl. No. 11/694,694, filed Mar. 30, 2007, Non-final Office Action, mailed Jul. 9, 2008, 22 pages.
U.S. Appl. No. 11/694,712, filed Mar. 30, 2007, Non-final Office Action mailed Aug. 21, 2008, 12 pages.
U.S. Appl. No. 11/694,742, filed Mar. 30, 2007, Non-final Office Action, mailed Aug. 20, 2008, 10 pages.
USPTO Final Office Action in U.S. Appl. No. 11/694,712, mailed Feb. 9, 2009, 11 pages.
USPTO Non Final Office Action in U.S. Appl. No. 11/694,712, mailed Apr. 10, 2009, 9 pages.
USPTO Final Office Action in U.S. Appl. No. 11/694,694, mailed Feb. 4, 2009, 19 pages.
USPTO Non Final Office Action in U.S. Appl. No. 11/694,739, mailed Apr. 2, 2009, 17 pages.
USPTO Non Final Office Action in U.S. Appl. No. 11/694,763, mailed Mar. 19, 2009, 16 pages.
USPTO Non-Final Office Action in U.S. Appl. No. 12/625,339, mailed Mar. 31, 2010, 8 pages.
USPTO Non-Final Office Action in U.S. Appl. No. 12/469,604, mailed Mar. 19, 2010, 7 pages.
USPTO Non-Final Office Action in U.S. Appl. No. 11/694,779, mailed Jan. 6, 2010, 24 pages.
USPTO Non-Final Office Action in U.S. Appl. No. 11/694,791, mailed Feb. 5, 2010, 12 pages.
Korean Intellectual Property Office, Korean Office Action in Application No. 10-2008-7030400, dated Feb. 10, 2011, 4 pags.

\* cited by examiner

OFF-DIE CHARGE PUMP THAT SUPPLIES MULTIPLE FLASH DEVICES

CLAIM OF PRIORITY

This application claims priority under 35 USC §119(e)(1) to U.S. Provisional Patent Application Ser. No. 60/800,357, filed on May 15, 2006, the entire contents of which are hereby incorporated by reference.

TECHNICAL FIELD

Various implementations may relate generally to non-volatile memory devices, and particular implementations may relate to systems and methods for operating multi-level flash cells.

BACKGROUND

As computing devices have increased in capabilities and features, demand for data storage devices has grown. Data storage devices have been used, for example, to store program instructions (i.e., code) that may be executed by processors. Data storage devices have also been used to store other types of data, including audio, image, and/or text information, for example. Recently, systems with data storage devices capable of storing substantial data content (e.g., songs, music videos, etc.) have become widely available in portable devices.

Such portable devices include data storage devices (DSDs) that have small form factors and are capable of operating from portable power sources, such as batteries. Some DSDs in portable devices may provide non-volatile memory that is capable of retaining data when disconnected from the power source. Portable devices have used various non-volatile data storage devices, such as hard disc drives, EEPROM (electrically erasable programmable read only memory), and flash memory.

Flash memory has become a widely used type of DSD. Flash memory may provide a non-volatile memory in portable electronic devices and consumer applications, for example. Two types of flash memory are NOR flash and NAND flash. NOR flash typically provides the capacity to execute code in place, and is randomly accessible (i.e., like a RAM). NAND flash can typically erase data more quickly, access data in bursts (e.g., 512 byte chunks), and may provide more lifetime erase cycles than comparable NOR flash. NAND flash may generally provide non-volatile storage at a low cost per bit as a high-density file storage medium for consumer devices, such as digital cameras and MP3 players, for example.

Typical flash memory stores a unit of information by storing an electrical charge in each memory cell at a voltage representative of a digital data value. Single level cells store one bit of information based on the cell being charged to a "high" voltage, or being discharged to a "low" voltage. NAND flash memory has been developed that stores up to two bits of information in a single cell by decoding the charge as being within one of four different voltage ranges. NOR flash memory has been developed that can store up to 8 bits of information in a single cell by decoding the charge as being within one of 256 different voltage ranges.

SUMMARY

Described apparatus and associated systems, methods and computer program products relate to multi-level data storage in flash memory devices.

In one general aspect, data is stored using multiple flash memory dies. Each flash memory die includes multiple flash memory cells. A charge pump is adapted to supply charge at a predetermined voltage to each flash memory die of the multiple flash memory dies. An interface is adapted to receive instructions for controlling the charge pump.

Implementations may include one or more of the following features. The charge pump is located on a die that includes a flash disk controller, on a printed circuit board, and/or on a die including an analog-to-digital converter. An analog interface is electrically connected to the flash memory dies to detect analog voltage signals from the memory cells on each flash memory die. A controller die includes the analog interface and the charge pump. The controller die further includes a flash disk controller. The analog interface further includes an analog-to-digital converter to convert detected analog voltage signals from the flash memory cells into digital representations of the analog voltage signals. The analog interface further includes a multiplexer for receiving multiple analog voltage signals. The charge pump supplies a voltage of between approximately 12 and 30 volts. A host device is adapted to control the charge pump by sending instructions via the interface. The host device modifies the instructions for controlling the charge pump based upon a detected temperature. The system or host device is adapted to turn off charge pump power to one or more of the flash memory dies. The flash memory cells are NAND flash memory cells.

In another general aspect, a semiconductor die includes multiple flash memory cells and an input adapted to receive programming charge from an external supply node. The supply node is regulated to a voltage sufficient to program the flash memory cells, and the supply node is external to the semiconductor die.

Implementations may include one or more of the following features. The external supply node comprises a charge pump. The supply node supplies a voltage of between approximately 12 and 30 volts. The memory cells are multi-level flash memory cells.

In another general aspect, a voltage is selectively supplied to multiple flash memory dies from a common source. Each flash memory die includes multiple flash memory cells. The voltage is sufficient to program the flash memory cells, and the common source provides power at the programming voltage.

Implementations may include one or more of the following features. The common source is a charge pump or a disk controller. The disk controller includes an analog interface for receiving voltage level signals from each memory cell during a read operation. The common source provides a programmable voltage of between approximately 12 and 30 volts. The flash memory dies each include more than one multilevel NAND flash memory cells. The supply of voltage is controlled by a host device and/or based upon a detected temperature. The operation of selectively supplying the voltage to the memory cells involves turning off programmable charge to one or more of the flash memory dies.

Some implementations may provide one or more advantages. For example, some implementations may provide high performance data storage functions. Storage density and/or capacity may be increased. Some examples may provide improved reliability and/or reduced data error rates. Various implementations may permit increased levels of integration, miniaturization, reduced electromagnetic noise and/or improved noise margins. Some implementations may realize lower system cost in auxiliary systems, such as voltage supplies to logic and/or programming/erase circuits.

The details of one or more implementations of the invention are set forth in the accompanying drawings and the description below. Other features of the invention will be apparent from the description and drawings, and from the claims.

DESCRIPTION OF DRAWINGS

Like reference symbols in the various drawings indicate like elements.

DETAILED DESCRIPTION OF ILLUSTRATIVE EXAMPLES

Various implementations relate to flash memory capable of storing information in deep multi-level cells (MLCs). Deep multi-level cells may encode at least several bits of data according to a cell voltage. Some implementations relate to architectures for implementing systems that include deep MLC flash memory. Some implementations relate to techniques for performing data storage operations with deep MLC flash memory.

Figure 1:
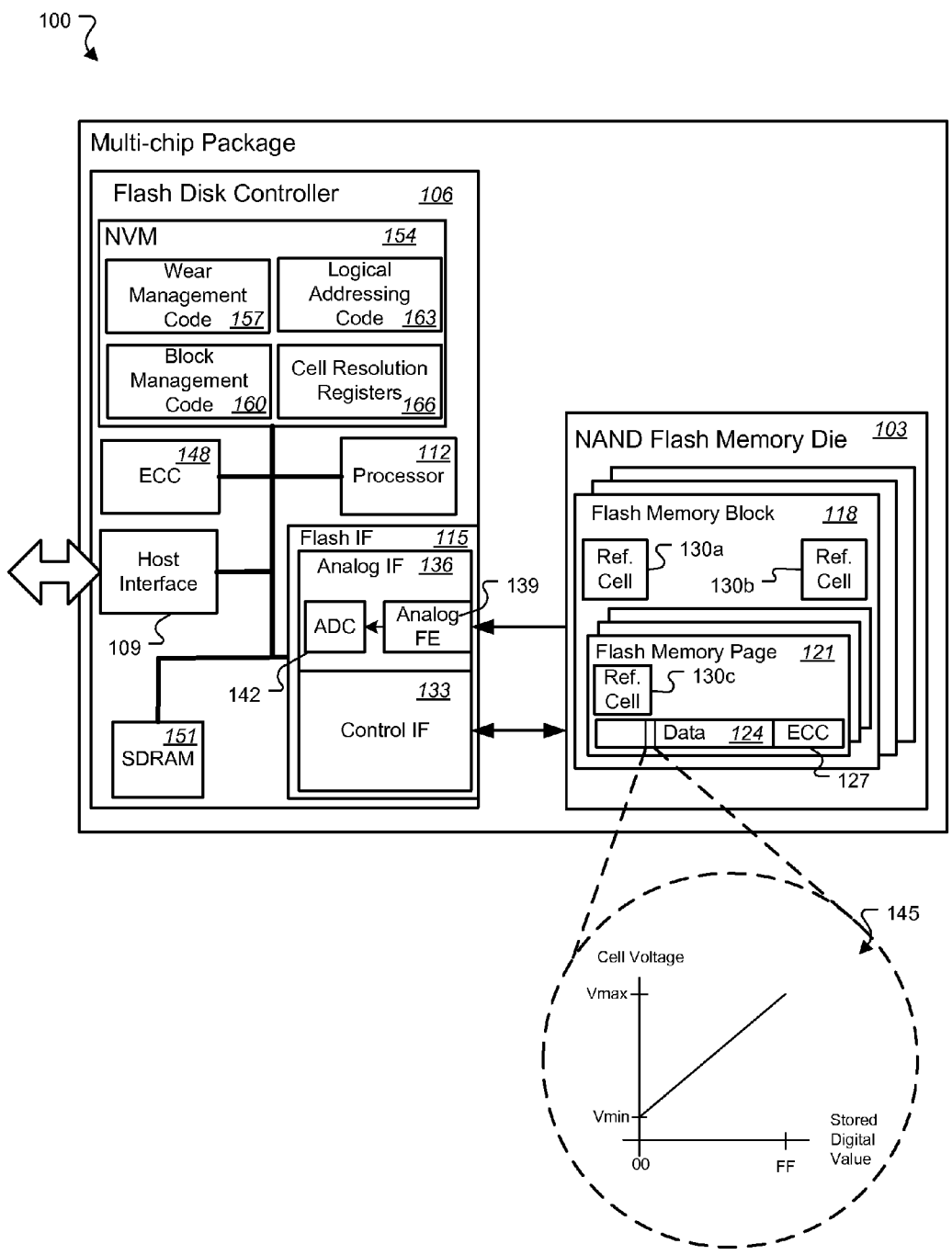
FIG. 1 shows an example of an architecture of a multi-chip package that includes a NAND flash memory die and a flash disk controller.

FIG. 1 shows an example of a multi-chip package (MCP) 100 that provides data storage for a host device (not shown). The MCP 100 includes a NAND flash memory die 103 for storing data and a flash disk controller (FDC) 106 that facilitates access to the flash memory in response to read and/or write commands from the host. In some implementations, the NAND flash memory die 103 stores data in deep MLCs. For example, cells in the flash memory die 103 may hold 3, 4, 5, 6, 7, 8, 9, 10 or more bits of information. The MCP 100 may provide data storage in various portable devices, such as digital cameras, other image storing devices, portable audio devices, personal digital assistants (PDA), and digital video recorders, for example. Some implementations may also be used in other applications, examples of which may include desktop computers, servers, wireless routers, or embedded applications (e.g., automotive), particularly in situations where quick access to data is desirable. In general, apparatus and techniques according to examples described herein may be implemented to increase flash memory density and/or to realize high performance and/or reliable non-volatile data storage operations.

As an illustrative example, the MCP 100 may store a data file by storing a byte (i.e., 8 bits) of information in each cell in a group of cells (e.g., a page or a block) in a flash memory. Some other examples may have resolutions such as 16-bit, 32-bit, 64-bit, or more. In some implementations, resolution may be determined by single or multiple electron detection on a gate of a cell. In other implementations, any practical number of bits of information may be encoded in a voltage to which an individual flash memory cell is charged.

The FDC 106 includes a host interface 109, a processor 112, and a flash interface 115. The FDC 106 receives commands and/or data (e.g., software code updates or user data) from and/or transmits data to a host device, such as a processor on a desktop computer, server, or portable computing device, via the host interface 109. Communication with the host may use custom or standard protocols, such as Advanced Technology Attachment (ATA), Serial ATA (SATA), Block Abstracted NAND, Secure Digital (SD), or Multi-Media Card (MMC), for example. In some implementations, the MCP 100 may be part of the same product as the host device. In other implementations, the host device may be in operative communication with the MCP 100 through a communication link (e.g., USB, Firewire, Bluetooth) to at least one other processor-based device. For example, a host may access the MCP 100 remotely by sending control messages and sending and receiving data messages over at least one network, which may include wired, wireless, or fiber optic links, or a combination of these. Such networks may support packet-based communications, and may include a local network or a wide area network, such as the Internet.

The processor on the host device may read data from and/or write data to the NAND flash memory die 103 using a logical addressing scheme that is processed by the FDC 106 to identify physical addresses in the flash memory. In some implementations, the host interface 109 may be configured to communicate with the host device using an ATA/IDE interface. The processor 112 may process the received command and use the flash interface 115 to access the NAND flash memory die 103. The FDC 106 may be configured to provide functionalities, such as wear management, block management, error correction, and logical addressing management functionalities, to improve performance of the NAND flash memory die 103, such as increasing reliability, decreasing read and write time, improving power efficiency, and increasing capacity per chip volume. Certain techniques and apparatus described herein may be applicable to NAND and/or NOR flash memory, to other types of electrically erasable or electrically writable memory, or to memory in which data access resolution is in pages or blocks.

Although only one NAND flash memory die 103 is shown in FIG. 1, the MCP 100 may include more than one NAND flash memory die 103. Some implementations may include any combination of non-volatile memories, which may include NAND flash, NOR flash, or electrically erasable programmable read only memory (EEPROM). In some illustrative examples, the MCP 100 can include two, three, four, or at least eight NAND flash memory dies 103. For example, the MCP 100 may include a flash disk controller 106 on a die that is packaged with (e.g., in a stack) four NAND flash memory dies 103.

In some implementations, the flash disk controller 106 and the flash memory die 103 may be implemented on a single die. In other implementations, one or more of the components in the flash disk controller 106 may be implemented in part or entirely external to a single die or the MCP 100. For example, some or all of the synchronous dynamic random access memory (SDRAM) 151 and/or the non-volatile memory (NVM) 154 may be implemented external to the MCP 100. In some implementations, some or all of the flash disk controller 106 may be packaged separately from the flash memory die 103. In an illustrative example, the NVM 154, the SDRAM 151, the host interface 109, and at least a portion of the processor 112 may each be implemented externally to the MCP 100. In other implementations, the analog and/or digital signals between the flash interface 115 and the flash memory die 103 may be externally routed to an integrated package.

Remote or distributed transmission structures (e.g., shielded and/or controlled impedance signal paths) may be implemented to transport signals to and/or from at least one flash memory die 103. In some implementations, memory expansion may be provided by installing additional packages of non-volatile memory. Buffering and/or routing devices may be used to support distribution of analog and/or digital signals to a variable number of memory dies 103. Furthermore, functions of the processor 112 may be performed external to the MCP 100. In various examples, the processor 112 may be implemented, in whole or in part, in a circuit on the same substrate (e.g., printed circuit board) or in the same product as the MCP 100. The processor 112 may be implemented from another computing device in operative communication with the MCP 100 through a communication link (e.g., wired, wireless, fiber optic, or a combination of any of these).

The MCP 100 may have any practical memory size, such as up to at least 100 gigabytes or more. In the depicted example, the NAND flash memory die 103 is organized to include a number of flash memory blocks 118. In some implementations, the NAND flash memory die 103 may include hundreds or thousands of flash memory blocks 118. Each flash memory block 118 includes a number of flash memory pages 121. As shown, each flash memory page 121 includes cells that may store data 124 and cells that may store error correction codes (ECCs) 127 associated with the data. As an example, the flash memory page 121 may store 2048 bytes of data and 64 bytes of ECC data. The data cells 124 store information received from the flash disk controller 106. The ECC cells 127 store additional integrity meta-data (e.g., ECC data) that is associated with the data stored in the data cells 124. In various implementations, the ECC data allows the flash disk controller 106 to detect and/or correct bit errors in the data.

In the illustrated example, each flash memory block 118 also includes one or more reference cells 130*a*, 130*b*, 130*c*. In some implementations, the FDC 106 may monitor the voltage in the reference cells 130*a*, 130*b*, 130*c* to estimate the degree of voltage sag or drift, in the cells 124, 127. In each block 118, the reference cell 130*a* may be located at the beginning of the block 118, and the reference cell 130*b* may be located at the end of the block 118. Each flash memory page 121 may include the reference cell 130*c*. In some implementations, a greater or lesser number of reference cells may be distributed in any pattern across the pages, blocks, and dies of the memory 103 to determine the likely performance of the cells 124, 127.

In some implementations, reference cells may be located in or around cells that experience read/write usage levels that are representative of the usage level of certain data cells of interest. Compensation methods may be based on comparing non-reference cells to other non-reference cells. For example, if voltages in a number of cells in the same page or block are relatively low, then compensation may include adjusting thresholds (e.g., voltage thresholds between different value levels in a cell) downward according to the measured values so that read errors may be substantially reduced. Other examples include determining a correction function based upon the detected voltages in reference cells, the correction function adjusting the detected voltage prior to converting the detected voltage into the digital data value represented by the memory cell.

In some implementations, memory cells may be refreshed by applying additional charge to a plurality of cells to correct for detected voltage sag. For example, if the voltage level of one or more reference cells indicate more than some threshold amount of voltage drift, then the memory cells in the page(s) or block(s) associated with the reference cell(s) may be either adjusted by applying additional charge or rewritten to restored the cells to appropriate voltage levels according to the stored data. Such adjustments can be performed immediately upon detecting the voltage drift in the reference cell (s) or as part of a later maintenance operation. In some implementations, additional charge may be applied or the memory cells may be rewritten based on the difference between the detected reference cell voltage(s) and the target reference cell voltage(s), which may be assumed to indicate the approximate amount of voltage drift or sag for both the reference cell(s) and the corresponding data cells.

In other implementations, applying additional charge or rewriting of the memory cells may be performed by reading all of the cells, performing any necessary adjustments to thresholds (e.g., using a correction function based on the reference cell voltages and/or using other techniques described herein), and performing error correction on the detected data to obtain the stored data. Thereafter, the data can be used to determine appropriate voltage levels or how much additional charge is needed for the various memory cells to correct for the identified voltage drift or sag. In some implementations, the amount of additional charge applied may be determined based on a correction function that is the same or similar to the correction function used to adjust detected voltages prior to converting the detected voltages into digital data values.

In some implementations, cells in the flash memory may be adaptively re-assigned. For example, reference cells may be added, removed, relocated, and/or redistributed as needed in response to read or write usage information, temperature, product age, supply voltage (e.g., low battery, AC-line powered), and/or detected error levels. If errors in certain blocks or pages of memory are low, then fewer cells may be assigned as ECC cells 127 and/or reference cells 130, which allows for more data cells 124. The relative assignments of cells to reference, data, and ECC functions, as well as the resolution of individual cells, may be dynamically adjusted based on current operating conditions, and/or according to predetermined conditions. For example, the resolution may be adjusted based on error rates, the number of ECC cells per page may be based on error rates and read and write history information, and the location and distribution of reference cells may be based on error rate and product age. This example merely illustrates that the controller 106 and the flash memory die may be dynamically adjusted according to various criteria. Other criteria may include criticality of the data, power source availability (e.g., AC line power, battery power), and defined criteria about the relative importance of maximizing memory size, speed performance, and data integrity. For example, maintaining a high cell resolution that requires a substantial number of software corrections may result in longer access times. The criteria may be tailored by the user, product manufacturer, or software, according to the needs of the application.

In some implementations, data that requires a substantial number of software corrections may be rewritten in a maintenance operation to correct for variations in charge associated with the passage of time or to correct for pages of memory cells that have begun to degrade. Typically, when changing the resolution of one or more memory cells, the data will be written to a different page of memory cells, and may be written at the same or a different resolution. In some implementations, the original page of memory cells will be downgraded to a lower resolution, which will often be required as the memory cells age and degrade. When rewriting of data is performed as a result of identified voltage drift or sag, it is possible to write the data to the same or a different page or block of memory cells.

The flash interface 115 provides direct control, handshaking, and data transfer access to the flash memory die 103. The flash interface 115 includes a control interface 133 and an analog interface 136. In some implementations, the control interface 133 may send control, address, and data signals to the flash memory die 103. The commands and the memory addresses may be transmitted in digital signals or analog signals. The flash disk controller 106 can also receive analog signals from the flash memory die 103. The flash disk controller 106 may include a processor for interfacing with flash memory logic on the flash memory die 103, and this processor for interfacing with the flash memory logic on the flash die may be integrated into the flash interface 115.

In response to a read command, the flash memory die 103 may output cell voltages representing data stored in individual data cells 124. The flash disk controller 106 can receive the analog voltage signals output from each memory cell on the flash memory die 103. These analog cell voltages or analog voltage signals may be transmitted to the analog interface 136 in the FDC 106. In some implementations, the flash interface 115 may also include a data bus separate from the control interface 133 and analog interface 136 for communicating with the flash memory die 103.

The analog interface 136 may include an analog front end (analog FE) 139 and an analog-to-digital converter (ADC) 142. Upon receiving the analog signals, the analog FE 139 may condition the signals as needed, for example, to provide offset, corrective level shift, gain, buffering, filtering, or controlled impedance to minimize reflections. The analog FE may provide a high impedance input to minimize loading of the flash memory cell, and a low impedance output to drive a sample and hold or track and hold circuit that is coupled to an input of the ADC 142. In some implementations, the analog FE 139 may further include an analog multiplexer (not shown) to select one of a number of analog output lines from one or more flash memory dies.

The ADC 142 processes the analog value to determine a corresponding digital data value representation of the voltage in the data cells 124, 127. The ADC 142 receives the conditioned analog signal and convert the analog signal into a digital representation of the analog voltage. The ADC 142 (or a processor in the ADC) then converts the digital representation into a digital data value represented by the voltage stored on the memory cell based on, for example, a mapping function. The processor 112 could also be used to convert the digital representation into a digital data value. The digital representation of the analog voltage may include enough information to allow the ADC 142 or a processor to distinguish among a plurality of analog voltage levels each representing a particular digital data value. The digital representation may comprise a greater number of bits of data than the digital data value. In some implementations, the ADC 142 may be integrated into the flash memory die 103 rather than being included in the flash disk controller 106. In such a case, the flash interface 115 may receive digital representations of cell voltages or digital data values from the flash memory die 103.

An example of a mapping function 145 is shown. Based on the mapping function 145, the ADC 142 or the processor 112 may convert an analog cell voltage into digital representation and/or a digital data value. For example, there may be a series of analog voltage thresholds that can be used to map an analog voltage to a digital representation and/or digital data value. Likewise, the mapping function 145 may also illustrate the conversion of a digital representation of the analog voltage into a digital data value. For example, one or more digital representations of the analog voltage may map to a particular digital data value, with each digital data value having a corresponding distinct set of one or more digital representations.

In some implementations, the ADC 142 or the processor 112 may receive parameters that change the mapping function 145. For example, the FDC 106 may adapt the mapping function 145 based on current temperature, supply voltage, number of reads and write of the page data, and/or the voltage in the reference cells 130a, 130b, and/or 130c. In some implementations, adaptations to the mapping function may be based on voltage characteristics of neighboring data cells 124, ECC cells 127, and/or other cells. The mapping 145 between cell voltages and digital data values is described in further detail with reference to FIGS. 2A-2B. In some implementations, the ADC 142 or a processor may also operate responsive to an alternative value command to retrieve alternative values for the received analog signals or digital representations of the analog signals. Example implementations of the alternative value command are described in further detail with reference to FIGS. 6A-6C.

The flash disk controller 106 also includes an ECC engine 148. In various implementations, the ECC engine 148 may perform hardware and/or software error checking and correction using ECC cells 127. In some implementations, the ECC engine 148 may provide state machine-based data recovery. For example, the ECC engine 148 may detect the number of error bits in a page of data. Then, the ECC engine 148 may determine which ECC algorithm is used. As an example, the ECC engine 148 may be configured to first attempt a hardware ECC algorithm using, for example, Hamming or Reed-Solomon codes. If the hardware ECC algorithm is unsuccessful in recovering the page of data, then a software ECC correction may be attempted. An example method illustrating use of hardware ECC, software ECC, and other techniques in combination is described with reference to FIG. 5. In some implementations, the ECC engine 148 may provide error correction for up to at least about 10% or more of the size of a page of data. In some examples, a processor may determine which ECC algorithm to use.

In some implementations, the processor 112 will rewrite or refresh the data stored in a flash memory page if an ECC algorithm is used to recover data that includes more than some predetermined number or percentage of errors. In other implementations, the processor 112 will record the location, physical and/or logical, of data that included such errors in a maintenance log. The processor 112 will then rewrite or refresh that data during a maintenance operation (See FIG. 9). Maintenance operations may be performed when the host device is operating under a predetermined power condition, when the processor 112 has a predetermined amount of excess bandwidth, and/or at scheduled intervals.

The flash disk controller (FDC) 106 may include dynamic random access memory (DRAM). The flash disk controller 106 of this example also includes a synchronous dynamic random access memory (SDRAM) 151. For example, the SDRAM 151 may be a single data rate SDRAM or a double data rate SDRAM. In some implementations, the FDC 106 may use the SDRAM 151 as a high speed and high density buffer for storing temporary data such as output data for the host device and alternative digital values for a page of data, for example. FDC 106 may also include other types of RAM, such as DRAM. As an example, the FDC 106 may receive analog data from the NAND flash memory die 103.

The FDC 106 may then convert detected analog voltages into digital data, including, in some cases, alternative digital data values for one or more of the cells. Then the ECC engine 148 checks and corrects the digital data, possibly checking multiple different combinations of data values and alternative data values for the cells on each flash memory page 121. If the error correction is successful, then the processor 112 may store the digital data into a host output buffer in the SDRAM 151. In some implementations, the host device may retrieve data from the host output buffer. Alternatively, the flash disk controller 106 may forward data from the host output buffer to the host device. The SDRAM 151, or other cache memory, may further be used to store data to be written to the flash memory die 103.

The FDC 106 also includes a non-volatile memory (NVM) 154. In this example, the NVM 154 includes wear management software code 157, block management software code 160, logical addressing software code 163, and cell resolution registers 166, each of which contain instructions (or pointers to instructions in the flash memory) that, when executed by the processor 112, perform certain operations. In some implementations, the NVM 154 may be separate from the NAND flash memory die 103. For example, the NVM 154 may be a NOR flash memory or another NAND flash memory. In other implementations, the NVM 154 may be one or more pages in the NAND flash memory die 103. In other implementations, the NVM 154 may store pointers or memory locations to the data stored in the NAND flash memory die 103. In some implementations, the processor 112 may execute the wear management software code 157, the block management software code 160, and the logical addressing software code 163 to improve efficiency, performance, and/or reliability of the MCP 100.

The processor 112 may use the wear management software code 157 to manage the wear of pages 121, blocks 118, or die 103 in the MCP 100. For example, the wear management software code 157 may include instructions that, when executed by the processor 112, perform operations that include load balancing operations to swap the data in the most frequently used memory page to a less used memory page. The swapping operations may also include an updating of the logical addressing software code 163.

Figure 9:
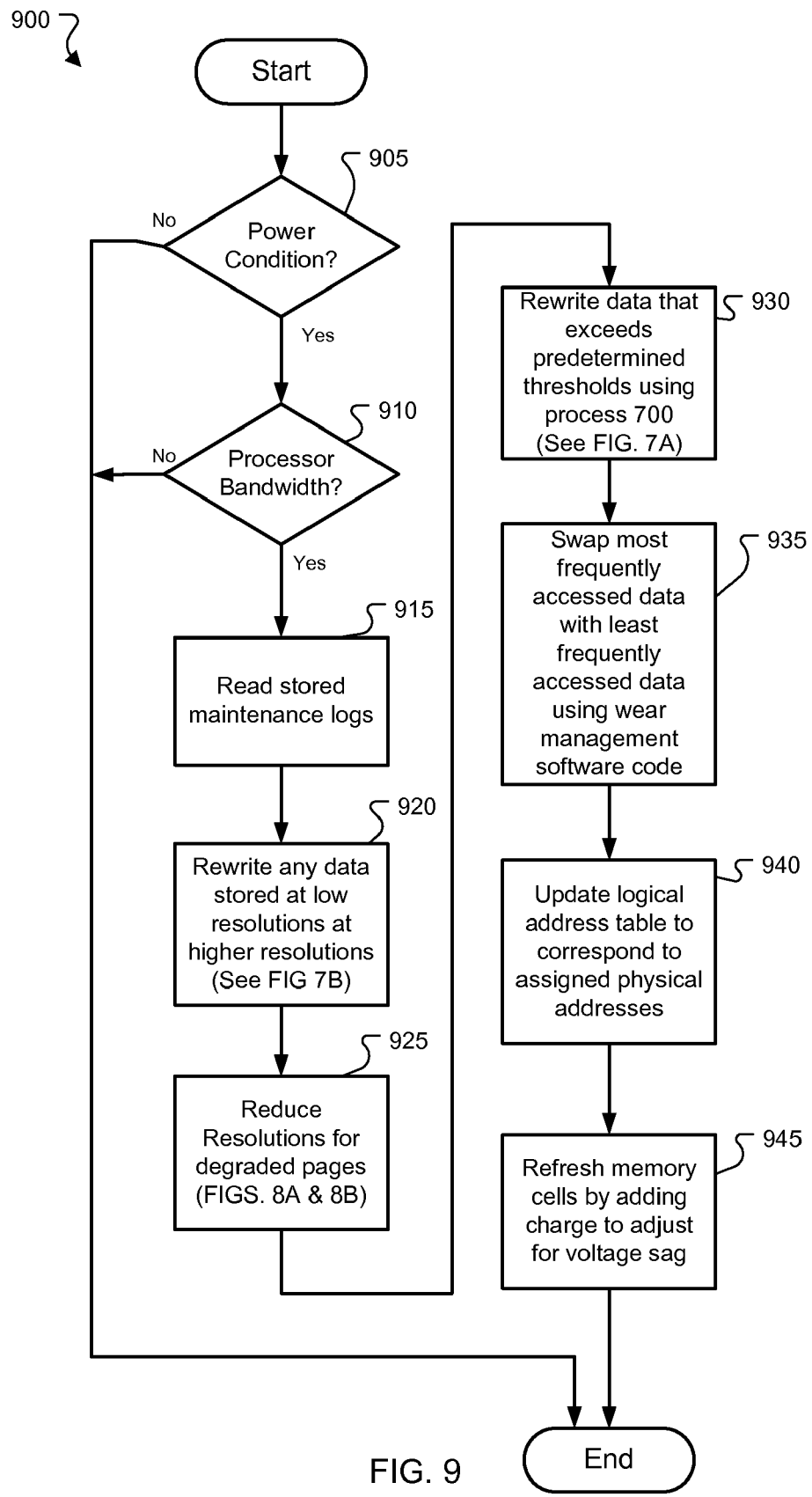
FIG. 9 shows a flow chart illustrating an example of a maintenance process.

The wear management software code 157 may be activated during a maintenance operation. In some implementations, the physical and/or logical addresses of each read operation is recorded in a maintenance log. Each write operation may also be recorded in a maintenance log. The wear management software code 157 may then use predetermined threshold values for determining how to rearrange stored data among the pages of memory cells. These threshold values, for example, might include 100 or 1000 reads of the page of memory cells during the course of a week or month. In other implementations, the threshold values might be based upon a percentage of the total number of read operations, or based upon deviation from the average number of reads per page per time. An example of a maintenance operation is depicted in FIG. 9.

The block management software code 160 may include code for managing bad blocks in the flash memory die 103. For example, the block management software code 160 may include historical error information about the flash memory blocks 118. In some implementations, the error information may be used to maintain the cell resolution in each of the flash memory pages. An example of the block management software code is described in further detail with reference to FIGS. 8A and 8B.

The block management software code 160, possibly in conjunction with the logical addressing software code 163 and/or the cell resolution registers 166, may also be used to pair sets of bad blocks or bad pages having reduced resolutions (updated in the cell resolution registers 166) in the flash memory die 103 and have the set of bad blocks or bad pages be treated for logical addressing purposes (perhaps updated in the logical addressing software code 163 and/or the cell resolution registers 166) as equivalent to a single block or single page of memory cells having the initial higher resolution. The block management software code 157 may be activated during a maintenance operation. An example of a maintenance operation is depicted in FIG. 9.

The logical addressing software code 163 may include code to convert a logical address in a host command to physical addresses in the NAND flash memory die 103. In some examples, a logical page may be associated with multiple physical memory pages in the NAND flash memory die 103. The logical addressing software code 163 manages the conversion and update of the logical address table in the NVM 154. In an example, the logical addressing software code 163 may dynamically maintain links between logical block addresses from the host and physical page addresses as the pages are downgraded from 10 bit resolution to 8 bit resolution, for instance, or as the mapping of logical block addresses to different physical page addresses are changed for purposes of wear management. Intermediate forms of addresses may be generated in the process of converting between logical and physical addresses, for example. Intermediate address forms may be generated, processed, stored, used, and/or otherwise manipulated to perform various non-volatile memory operations. An example of the logical addressing software code is described in further detail with reference to FIG. 10.

The cell resolution registers 166 store information about cell resolution in each flash memory page 121. For example, the NAND flash memory die 103 may be an 8-bit MLC flash memory. In some implementations, some of the flash memory block 118 may be downgraded or up-graded in response to various conditions. Illustrative examples of such conditions include error performance, temperature, voltage conditions, number of read or write cycles of individual cells, groups of cells, pages, cells in a neighboring location, reference cells, cells with comparable read and/or write usage history, or other factors, such as age of the device. Information about some or all of these conditions may be stored in a data storage device, or determined or estimated from one or more other bits of stored information. In one example, stored information may include historical read and write usage data that represents usage levels for at least some of the cells in the memory die 103. The processor 112 may update the cell resolution registers 166 to reduce a cell resolution of a down-graded memory page to, for example, 4-bit, so that the flash memory page 121 may still be usable with a smaller memory size. In other implementations, the cell resolution registers 166 may also store the cell resolution for each flash memory block 118.

In some implementations, the cell resolution registers 166 are downwardly adjusted to a single bit resolution or another low number bit resolution prior to transferring data from a host device to memory cells in the MCP 100. This process is depicted in further detail in FIG. 7B. Lowering of the cell resolution registers 166 prior to transferring data may allow for faster data transfer rates because less precision is needed in charging each memory cell. The transferred data may subsequently be rewritten to memory cells at a higher resolution. In some implementations, the transferred data may be rewritten at a higher resolution during a maintenance operation (e.g., during a later time when sufficient processing resources are available and the rewriting does not interfere with other reading or writing operations). In some implementations, a record of the low cell resolution data transfer is made in a maintenance log.

In some implementations, the logical addressing software code 163, the resolution registers 166, and/or the block management software code 160 will group down-graded memory pages (or down-graded memory blocks) together and treat the group for logical addressing purposes as a single non-down-graded memory page (or block). The memory pages of the group of down-graded memory pages do not need to be adjacent memory pages. The group of down-graded memory pages can include memory pages from different blocks and even from different memory dies. In some implementations, each down-graded memory page or block in a group of down-graded memory pages or blocks is down-graded in response to an error condition associated with the page or block.

Figure 2A:
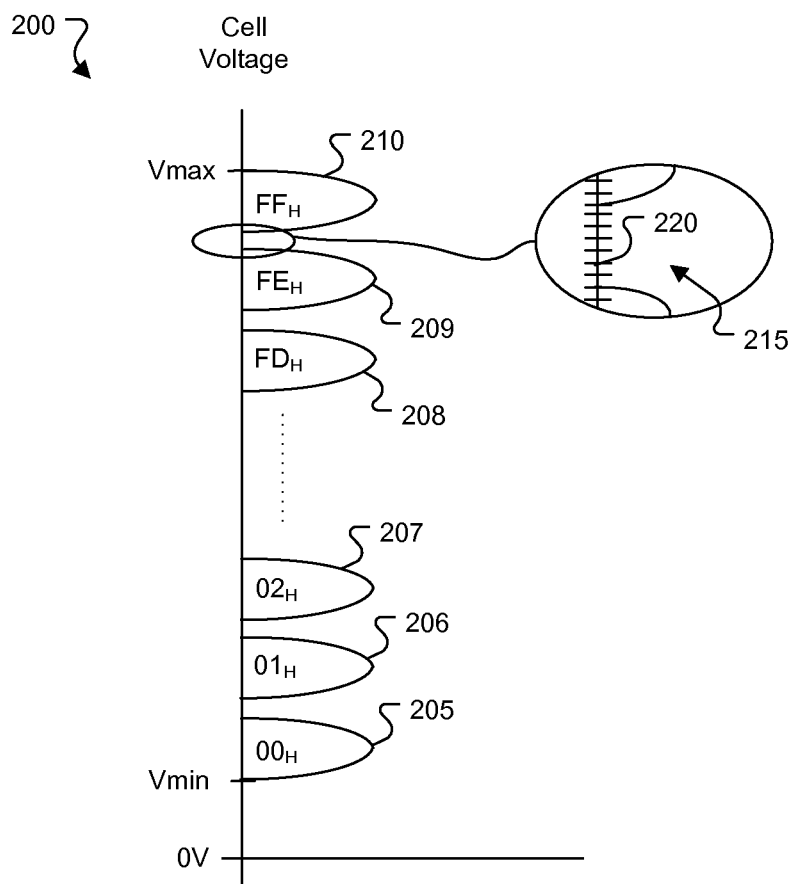
FIGS. 2A-2B collectively show a mapping between a cell voltages and digital values stored in a memory cell.
Figure 2B:
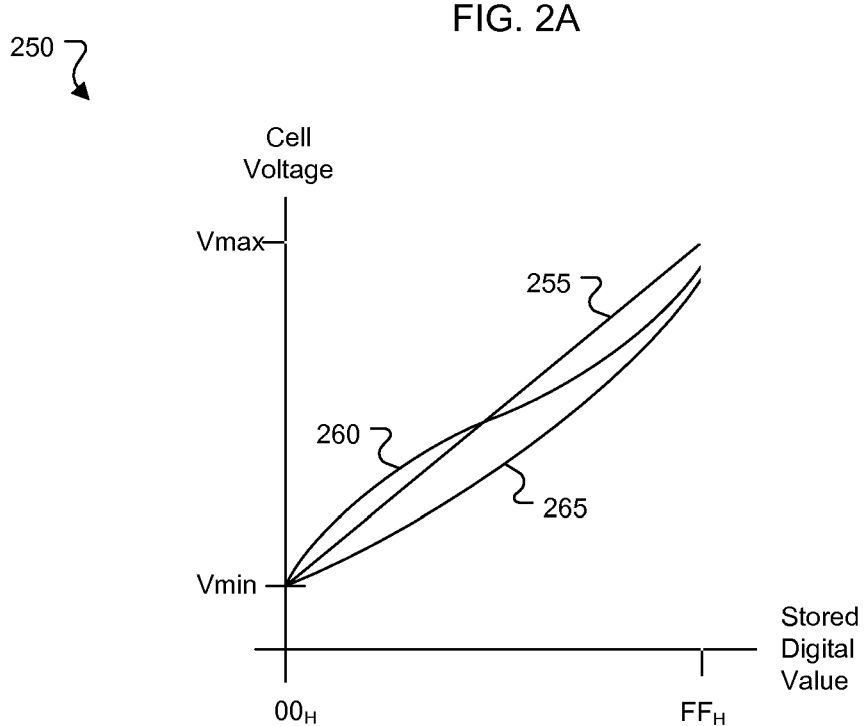

FIGS. 2A-2B collectively show mappings between cell voltages and digital data values stored in the memory cell. As shown in FIG. 2A, an illustrative digital data value distribution 200 of an 8-bit memory cell is shown. An 8-bit memory cell would include 256 possible digital data values; a 4-bit memory cell would include 16 possible data values. The number of possible data values is equal to $2^n$ (where n equals the number of bits), but the number of possible digital data values need not correspond to an n-bit number of possible digital data values. Each memory cell could have any integer number of possible digital data values greater than 1, for example, some memory cells could have 10 possible data values. The digital value distribution 200 includes digital value distribution curves 205-210 that represent the voltage distribution for each digital data value. Each digital value distribution curve (e.g., 205-210) represents a range of digital voltage values corresponding to voltage levels associated with each possible digital data value.

During a write operation, each memory cell receives a charge to an analog voltage corresponding to a digital data value selected from one of the possible digital data values. This corresponding voltage typically falls within the distribution curves 205-210 for the desired digital data value. This corresponding voltage could also be a target voltage corresponding to the digital data value. For example, if a cell voltage lies within the distribution 207, then the digital value stored in the cell may be $02_H$. During a read operation, an analog voltage signal is detected from each cell. The ADC 136 then converts the analog voltage signal into a digital representation of the analog voltage signal. This digital representation is then compared with at least one digital value distribution curve to determine the digital data value represented by the analog voltage stored in the read memory cell.

The digital data value distribution 200 includes grey areas 215 between the digital data value distribution curves 205-210. In some implementations, when the ADC 142 receives a cell voltage or detects an analog voltage signal that lies within one of the grey areas 215, the ADC 142 may, for example, convert the cell voltage to the nearest adjacent digital data value. For example, if the ADC 142 receives a cell voltage substantially near a voltage level 220, then the ADC 142 may resolve to the nearest adjacent digital data value, namely $FE_H$. In some implementations, the FDC 106 may also include an alternative value command that instructs the ADC 142 to resolve to an alternative value other than the nearest adjacent value based on some parameters.

In some implementations, the FDC 106 may use both the nearest adjacent digital data value and one or more alternative values in an error correction process that attempts to resolve a page or block of data values. Furthermore, the FDC 106 may assign an uncertainty to particular cell voltages or corresponding data values based on the location of the cell voltage within the digital data value distribution curves 205-210 or the grey areas 215. The assigned uncertainty may be used by an algorithm that attempts to resolve a page or block of data values. Some examples of these parameters may include one or more of temperature, number of reads to the cell, number of writes to the cell, supply voltage, and voltage in the reference cells 130a, 130b, 130c. In some examples, the cell voltage may drop below a minimum cell voltage (Vmin). The FDC 106 may implement a correction by adding an offset to the received cell voltage. This offset may be added by either the analog FE 139 or added digitally by either the ADC 142 or the processor 112.

In some implementations, the FDC 106 may dynamically adjust locations and the widths of the grey areas 215 by altering the digital data value distribution 200. For example, the FDC 106 may include maintenance software code that adjusts the grey areas 215 based on parameters such as one or more reference cell voltages, the usage of the memory cell, and other heuristics that may be preloaded in the NVM 154. The maintenance software code may also perform updating of the cell resolution registers 166. For example, each die 103, analog interface 135, and/or MCP 100 may be characterized at manufacturing time and a linearization table, correction factors, or other corrective adjustment may be stored in non-volatile memory in the MCP 100. In some cases, the maximum and minimum voltage levels (Vmax and Vmin) as well as the digital value distribution curves 205-210 may be adjusted and/or redistributed based on empirical testing of the cells during their lifetime of use.

As shown in FIG. 2B, a cell voltage to digital value graph 250 is shown. The graph 250 includes an ideal voltage characteristic 255 that the ADC 142 uses to convert analog voltages to digital values. In some examples, the data cell 124 may store digital values according to non-ideal voltage characteristics 260, 265 due to, for example, the heuristics of temperature, age of the cell, charge pump or supply voltage tolerances, non-linearity of the ADC 136, detected errors in the memory cell, and/or the number of reads and writes of the cell. The FDC 106 may compensate in various ways for the voltage characteristics 260, 265 to be closer to the ideal characteristics 255. Example compensation methods are described with reference to FIGS. 3-6.

Figure 3A:
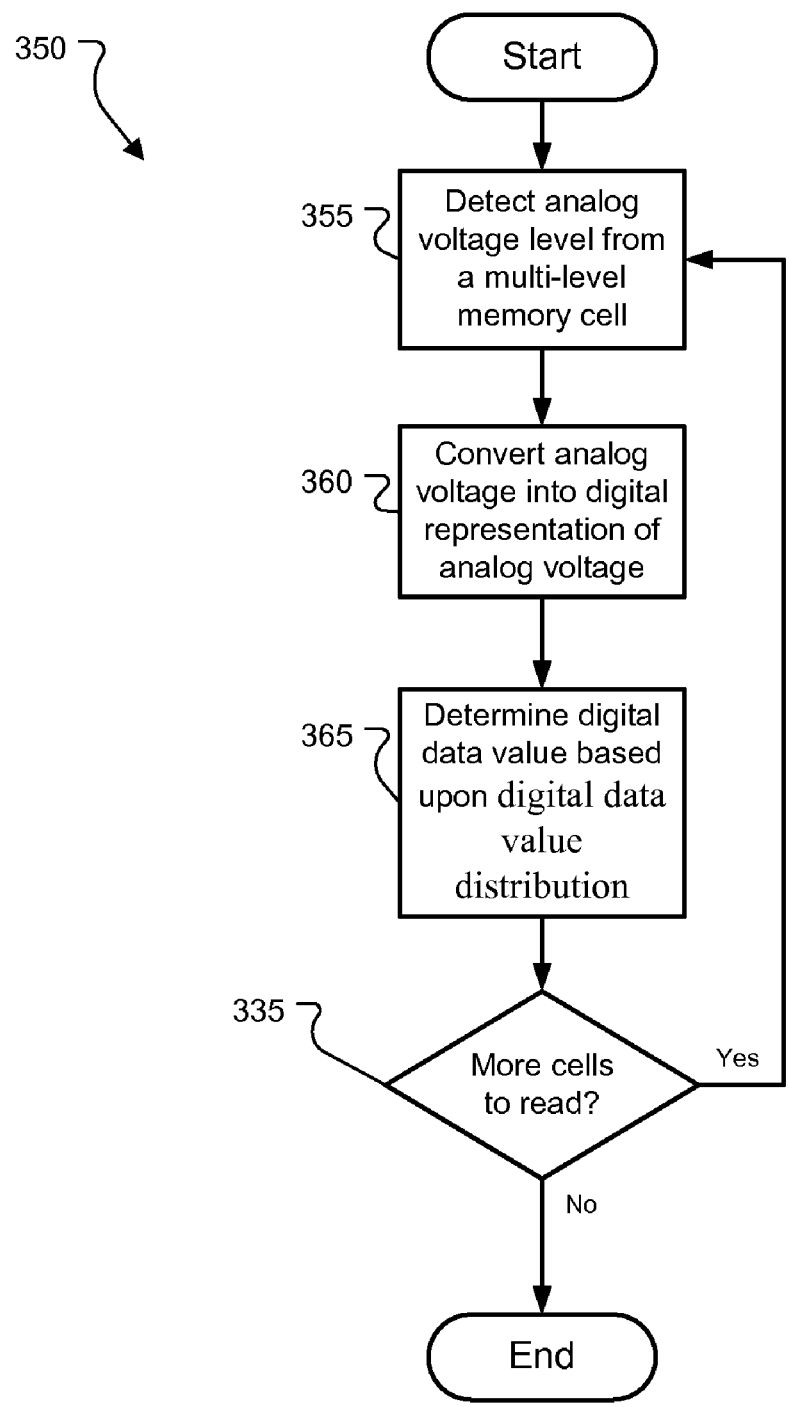
FIGS. 3A-3B show flow charts that illustrate examples of processes for reading pages of data from a multi-level cell flash memory.
Figure 3B:
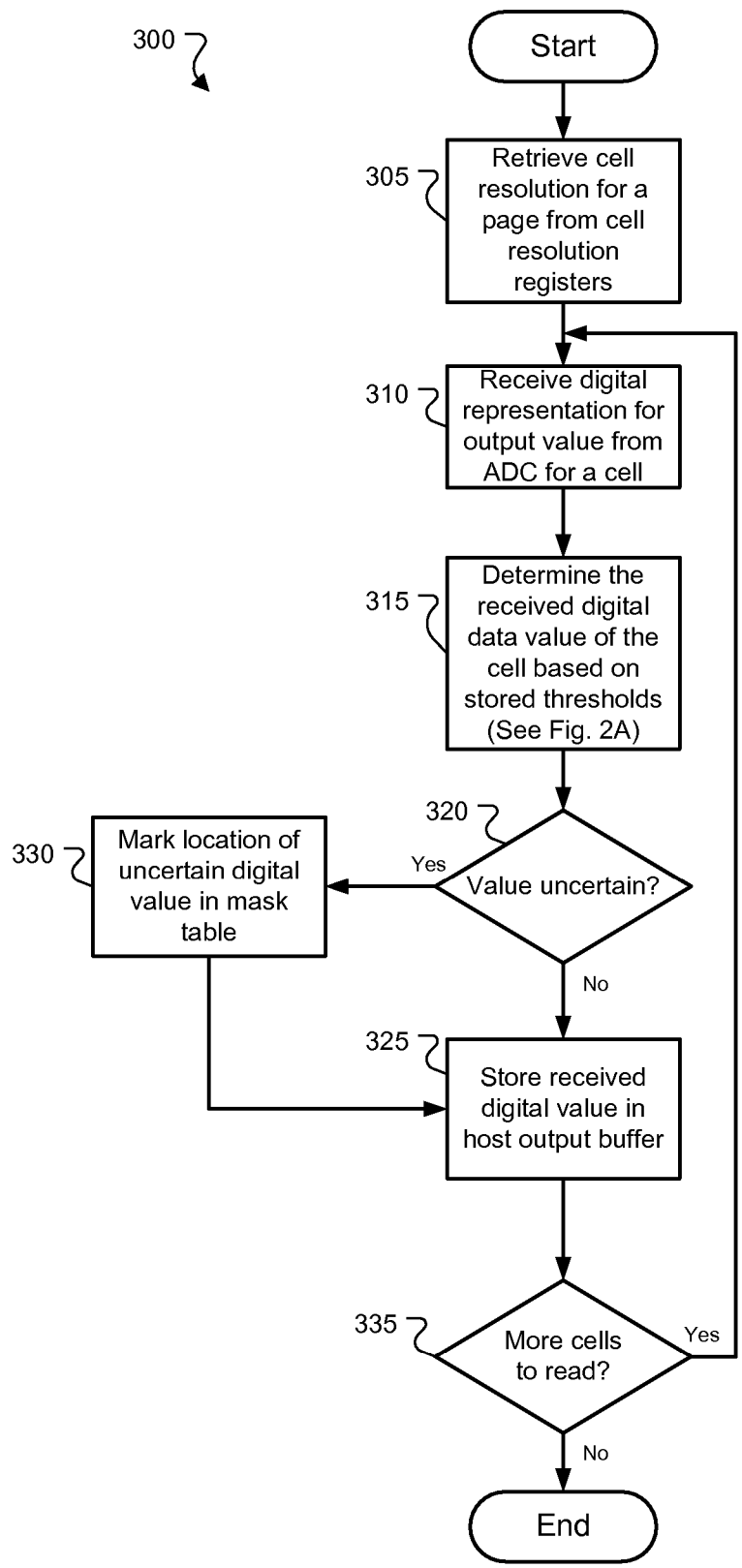

FIGS. 3A and 3B show flow charts that illustrate examples of processes 350 and 300 for reading a page of data from a NAND flash memory. The processes 350 and 300 include operations that may be performed generally by the processor 112. In some implementations, the processes 350 and 300 may also be performed, supplemented, or augmented by other processing and/or control elements that may be incorporated with the ADC 142. For example, there may be a controller or compensator in the analog interface 136 that performs some or all of the operations in the processes 350 and 300.

FIG. 3A depicts a process of converting detected voltage levels from multi-level memory cells into digital data values. The process 350 begins with detecting an analog voltage level from a multi-level memory cell (step 355). This voltage may be detected by the analog interface 136, for example. The analog interface 136 may include an input operable to receive analog signals from a flash memory die 103. The flash disk controller 106 may further include a control module to select memory cells from which the input receives analog signals. In step 360, the analog voltage signal is converted into a digital representation of the detected analog voltage. This conversion may be performed by the ADC 142. The digital representation may have sufficient data to allow for the ADC 142 or the processor 112 to distinguish the level of the analog voltage stored by a memory cell among a plurality of possible voltage levels representing a digital data value. This may be accomplished by having a digital representation comprising more bits of data than the digital data value represented by the voltage stored on the memory cell.

FIG. 2A helps illustrate this concept. The range of possible analog cell voltages may be segregated into multiple segments (e.g., such as represented by voltage level 220) that each correspond to a digital representation of the analog cell voltage. Each digital value distribution curve 205-210 and each grey area 215 may include multiple such segments, allowing for the use of digital representations having a higher resolution than the digital value distribution curves 205-210, which can provide additional information relating to, for example, where a cell voltage lies within a digital value distribution curve 205-210 or a grey area 215.

In step 365, the digital representation is converted into a digital data value based upon a digital data value distribution. The digital data value distribution may be stored in the cell resolution registers 166 and may be the digital data value distribution 200 shown in FIG. 2A. In step 335, a processor or controller determines whether there are more memory cells to read. If so, then the process returns to step 355. Otherwise, process 350 ends.

FIG. 3B depicts in greater detail a process of storing identified digital data values and marking the location of uncertain digital data values. The process 300 begins when, for example, the processor 112 receives a command to retrieve a page of data from the NAND flash memory die 103. In step 305, the processor 112 retrieves cell resolution information for a page from the cell resolution registers 166. Then, in step 310, the processor 112 receives from the ADC 142 a digital output value for a data cell. The digital output value for the data cell is a digital representation of the voltage detected from the data cell. The ADC 142 determines the received digital data value based on stored thresholds in step 310. In some implementations, the processor 112 may use information in the cell resolution registers 166 to determine which set of thresholds are used. These thresholds may relate to the digital value distribution curves 205-210 discussed above in regard to FIG. 2A. For example, the processor 112 may use one set of thresholds for an 8-bit cell and another set of thresholds for a 2-bit cell. In some cases, the processor 112 may use one set of thresholds for one 8-bit cell and another set of thresholds for a different 8-bit cell. Each set of thresholds may correspond to a possible digital data value distribution and may constitute ranges of digital representations of analog voltages that correspond to possible digital data values.

In step 320, the processor 112 determines whether the digital data values for a received analog voltage values are uncertain. In some implementations, the processor 112 may determine that a digital data value is uncertain if the cell voltage lies in a grey zone 215 of the digital value distribution 200 or if the cell voltage is near the boundary between a digital value distribution curve 205-210 and a grey zone 215. In some implementations, different levels of uncertainty can be assigned depending on where the cell voltage falls within the digital value distribution 200 (e.g., higher voltages may tend to have greater uncertainty and/or uncertainty may be higher for cell voltages that are closer to the middle of a grey zone 215). In step 320, if the processor 112 determines that the received digital values are not uncertain, then the processor 112 stores the received digital value in a host output buffer in step 325. If the processor 112 determines that the received digital value is uncertain in step 320, then the processor 112 may mark the location of the uncertain digital value in a mask table in step 330, and then executes step 325. In some implementations, one or more alternative values may also be stored for subsequent use in resolving which value (e.g., the uncertain value or one of the alternative values) is correct.

After the processor 112 stores the received digital value, the processor 112 determines, in step 335, whether there are more cells to read. For example, the processor 112 may check whether the end of the memory page is reached. If there are more cells to read, then the process returns to step 310. If there are no more cells to read, the process 300 ends. In some implementations, the process will also record the number of uncertain data values associated with a page or block of memory cells in a maintenance log. In other implementations, the process will record the location, physical and/or logical, of a page and/or block of memory cells if the number of uncertain data values exceeds a predetermined threshold.

Figure 4:
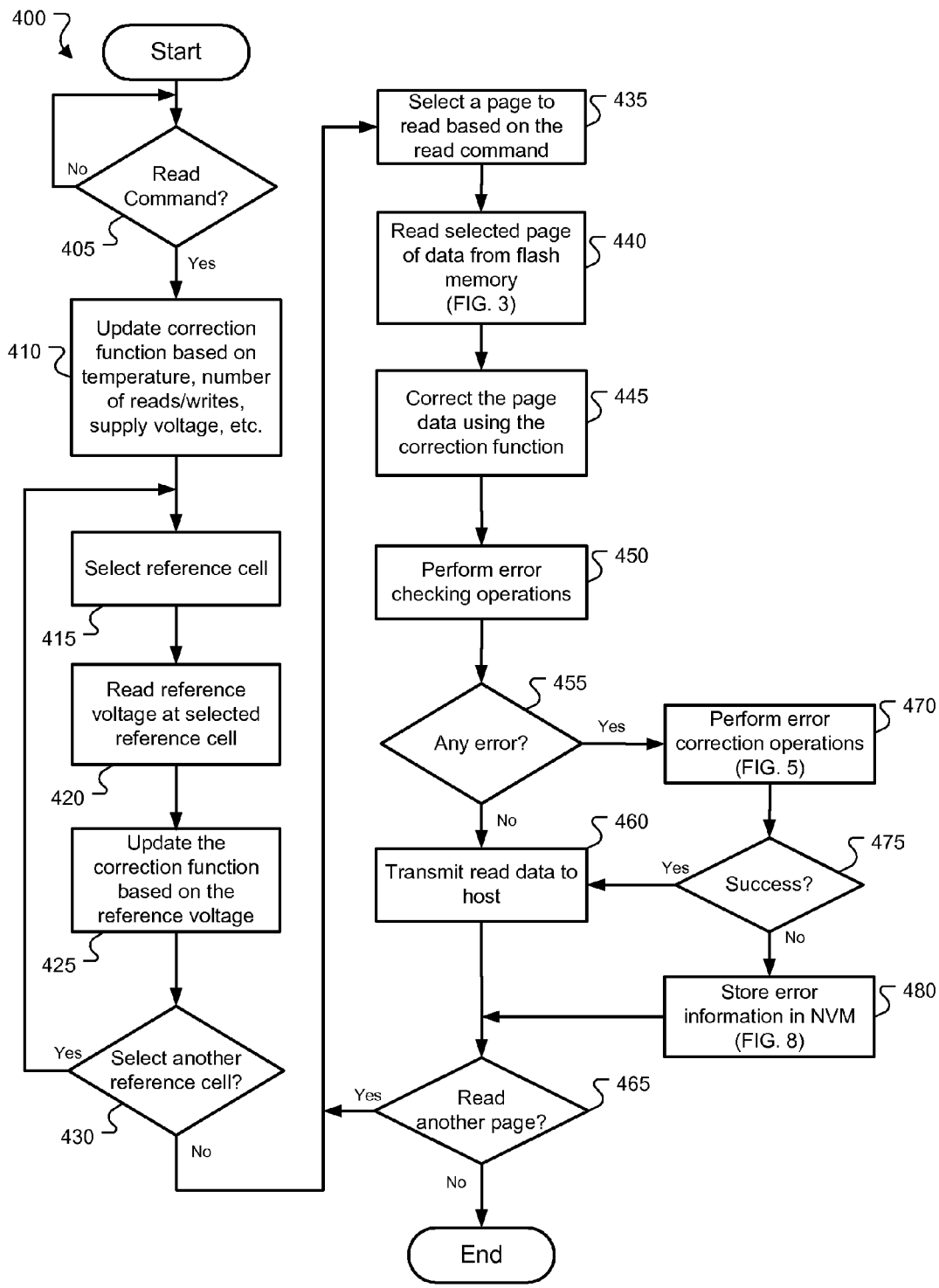
FIG. 4 shows a flow chart that illustrates an example of a process for reading a page of data from flash memory.

FIG. 4 shows a flow chart that illustrates an example of a process 400 for reading a page of data from an MLC flash memory, such as the NAND flash memory die 103, using a correction function to adjust mapping of the cell voltages to the digital values. The process 400 may be performed by the processor 112, for example. The process 400 begins in step 405 when the processor 112 determines whether a read command is received. For example, the FDC 106 may receive a read command from the host device through the host interface 109. If, in step 405, the processor 112 determines that no read command is received, then step 405 is repeated.

If the processor 112 determines that a read command is received in step 405, then the processor 112 updates a correction function in step 410 based on temperature, number of reads or writes in the memory page, supplied voltage, and/or other operating conditions of the NAND flash memory die 103. In some implementations, the ADC 142 or the analog interface 136 may use the correction function to adjust measured cell voltages at the analog front end 139 before the cell voltages are converted into digital values. In other implementations, the processor 112 may use the correction function to adjust the thresholds in the mapping function, so the ADC 142 may convert analog voltage into adjusted digital values. The correction function can be different for different cells. For example, memory cells having higher detected voltages can have a greater adjustment due to the correction function.

Next, the processor 112 selects a reference cell in step 415. For example, the processor 112 may select one of the reference cells 130a, 130b, or 130c. Then, the processor 112 reads, in step 420, a reference voltage stored in the selected reference cell. In step 425, the processor 112 updates the correction function based on the reference voltage. For example, if a reference voltage appears to be sagging by ten percent, then the processor 112 may adjust the correction function to compensate the sag voltage in the data. In some implementations, the correction function will non-linearly adjust detected voltage levels. The correction function may adjust higher detected voltages levels more than lower detected voltage levels. The correction function may adjust detected voltages at different voltage levels by different adjustment amounts or by different adjustment percentages.

In some implementations, thresholds may be dynamically adjusted on the fly during operation. In some implementations, the processor 112 may store a fixed number of previous samples, such as one hundred samples, of previously read reference voltages and use a moving average of the stored reference voltages to update the correction function. The correction function may also be updated based on other functions, which may involve mean, median, mode, or weighted averaging, for example. For example, a weighted moving average may be used. The processor 112 then, in step 430, determines whether to select another reference cell. As an example, the processor 112 may determine whether there is enough information to adjust the correction function. As another example, the processor 112 may be configured to read all the reference cells in some memory blocks as well as in some memory pages based on the read command.

If, in step 430, the processor 112 determines that there is another reference cell to be read, then the process 400 returns to step 415. In some implementations, the process of adjusting the correction function by reading the voltage in reference cells is triggered by detected errors in data retrieved from a group of memory cells. In other implementations, detected errors will result in a shift of thresholds for determining a data value associated with a detected voltage. These thresholds in some implementations may be automatically shifted down, but in other implementations the thresholds are adjusted based upon the voltage in one or more reference cells. The error may be detected by the use of ECC 127 associated with the group of memory cells.

If the processor 112 determines in step 430 that there is no other reference cell to be read, then the processor 112, in step 435, selects a page to read based on the read command. Then, in step 440, the processor 112 reads the selected page of data from flash memory using, for example, the process 300 (FIG. 3B). In step 445, the processor 112 corrects the page data using the correction function. For example, the processor 112 may set some parameters in the analog interface 136 to adjust the mapping function. As another example, the processor 112 may adjust the digital representation, output from the ADC 142, using the correction function. Next, the processor 112 can perform error checking operations to check if there is any error in the page in step 450. In some implementations, the error checking operations may be done in the ECC engine 148 using hardware error detection circuits. In other implementations, the error checking operations may be done in software, where the processor 112 may execute an error detection code stored in the NVM 154 to check for errors in the page. After the error checking operations, in step 455, the processor 112 can determine if any error is detected.

If there is no error detected, then the processor 112 may, in step 460, transmit the read data to the host device. Then the processor 112 may determine whether there is another page to read in step 465. If there are more pages to read, then the step 435 is repeated. Otherwise, the process 400 ends. If there are one or more errors detected in step 455, then, in step 470, the processor 112 may perform error correction operations, an example of which is described with reference to FIG. 5. Then the processor 112 may, in step 475, determine whether the error correcting operation is successful. If the error correcting operation is successful, then the step 460 is repeated. If the error correcting operation is not successful, then the processor 112 may store error information (e.g., an error log) in the NVM 154 in step 480 and the process may continue at step 465. The error information may also be stored in a maintenance log. The stored error information may be used for block management operations, for which an example is described with reference to FIG. 8. In some implementations, the processor 112 will record the variation in sag between reference cells in a page or block of memory cells in a maintenance log in NVM 154. In other implementations, the processor 112 will only record the location, physical and/or logical, of a page and/or block of memory cells in a maintenance log if the degree of sag in reference cells meets a predetermined condition. For example, if the sag in the reference cell exceeds 10% or if the difference between the degree of sag in different reference cells exceeds 10%, the data stored in the page and/or block of memory cells may be refreshed by applying additional charge to the memory cells or by completely rewriting the page during a maintenance operation. An example of a maintenance operation is described with reference to FIG. 9.

Figure 5:
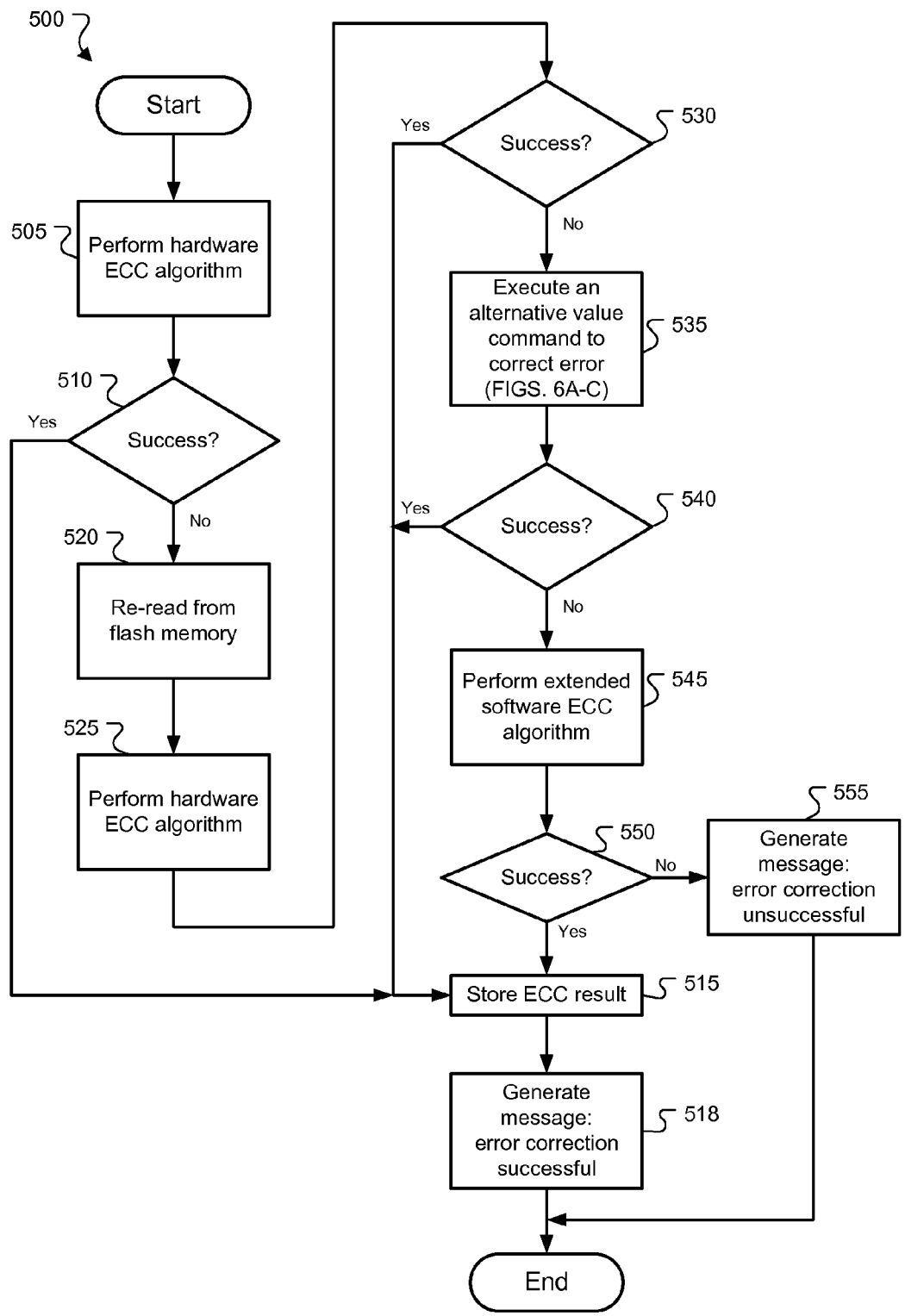
FIG. 5 shows a flow chart that illustrates an example of a process for performing error correction operations to correct a page of data containing bit errors.

FIG. 5 shows a flow chart that illustrates an example of a process 500 for performing error correction operations to correct a page of data containing bit errors. The process 500 begins when, for example, the processor 112 detects bit errors in a page of data read from the flash memory and sends a command to the ECC engine 148 to perform a hardware ECC algorithm to correct the bit errors in step 505. In some implementations, the ECC engine 148 and the ADC 142, and/or the analog interface 136 may cooperate to correct the bit errors.

Next, the ECC engine 148 may check, in step 510, whether the hardware ECC algorithm is successful. If the hardware ECC algorithm is able to correct all the errors in the page of data, then the hardware ECC algorithm is successful. Then, in step 515, the ECC engine 148 stores the ECC result in, for example, the SDRAM 151. Next, the ECC engine 148 generates a message to indicate "Error correction successful" in step 518 and the process 500 ends.

If the number of existing error bits exceed the number of error bits that the hardware ECC algorithm can correct, then the ECC engine 148 sends a message to the analog interface 136 to re-read, in step 520, the page of data from the flash memory. Next, in step 525, the ECC engine 148 performs a hardware ECC algorithm again. In step 530, the ECC engine 148 checks whether the hardware ECC algorithm is successful. If hardware ECC algorithm can correct, then the hardware ECC algorithm is successful, and the process continues with step 515.

In step 530, if the ECC engine 148 determines that the number of existing error bits exceed the number of error bits that the hardware ECC algorithm can correct, then the ECC engine 148 executes an alternative value command to correct the bit errors. Example implementations of the alternative value command are described with reference to FIGS. 6A-6C. Then, the ECC engine 148 may check whether the alternative value command corrects the bit errors in step 535. If the ECC engine 148 determines that the bit errors are corrected, then the process continues with step 515.

If the ECC engine 148 determines that the bit errors are not corrected, then the ECC engine 148 may perform an extended software ECC algorithm in step 540 to recover the page of data. For example, the extended software ECC algorithm may include deeper ECC algorithms that use more ECC bits. For example, the hardware ECC algorithm may require four ECC bits and the extended software ECC algorithm may use 128 ECC bits. Then, the ECC engine 148 may check whether the extended software ECC algorithm is successful in step 550. If the ECC engine 148 determines that the extended software ECC algorithm is successful, then the process continues with step 515. If, in step 550, the extended software ECC algorithm is not successful, then the ECC engine 148 generates, in step 555, a message: "Error correction unsuccessful" and the process 500 ends.

Figure 6A:
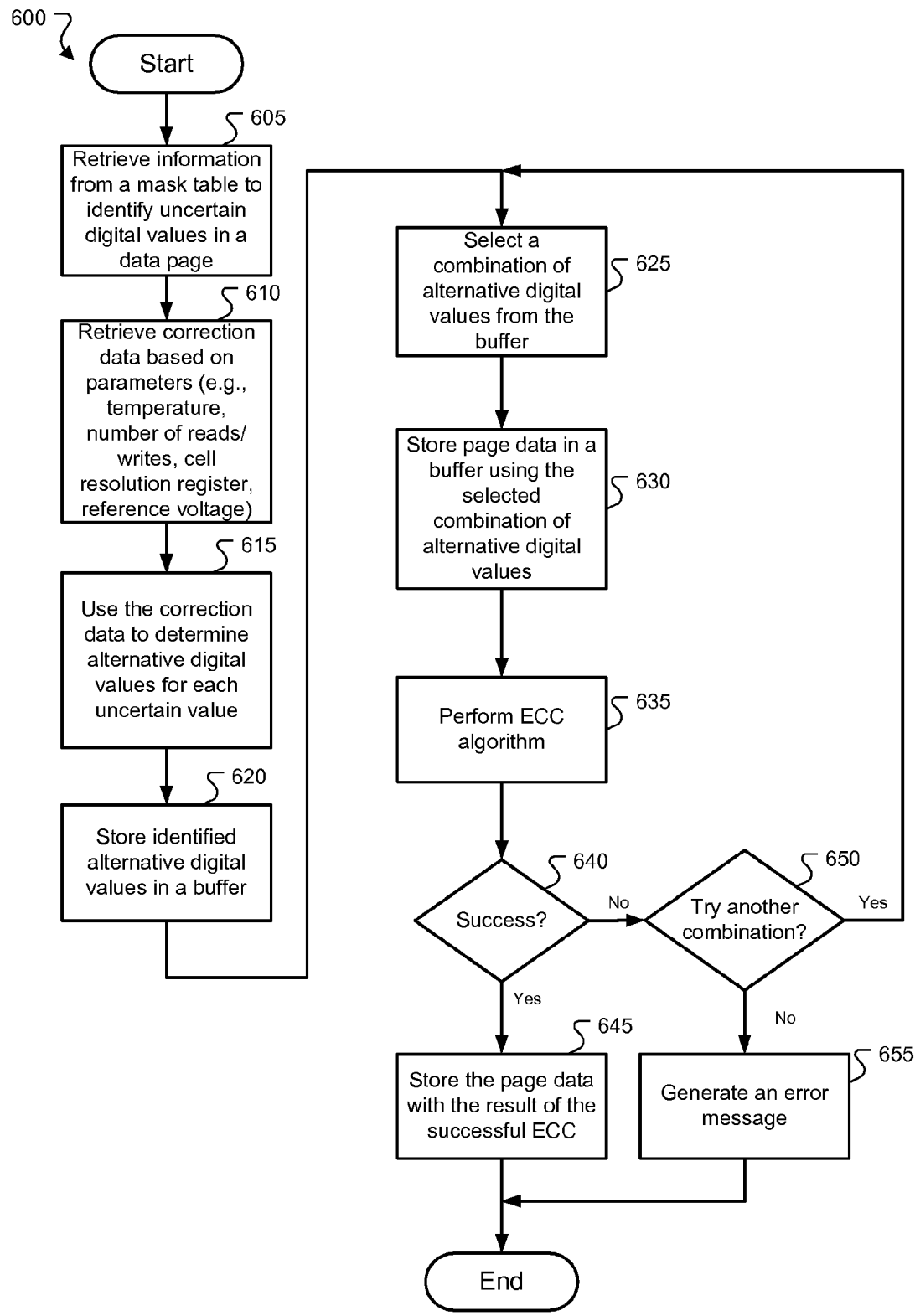
FIGS. 6A-6C collectively show examples of operations for executing an alternative value command.

FIG. 6A shows a flow chart that illustrates an example of a process 600 for generating and using alternative data values. The processor 112, the ECC engine 148, the flash interface 115, or other combinations of the above and other elements may perform the operations in the process 600. At step 605, the processor 112 retrieves information from a mask table to identify uncertain digital data values in a data page (see, e.g., FIG. 3, step 330) and, in some cases, to retrieve information regarding a degree of uncertainty.

Then the processor 112 may, in step 610, retrieve correction data based on parameters (e.g., temperature, number of reads from the data page, number of writes to the data page, information in the cell resolution registers 166, supply voltage, charge pump voltage, the reference voltage in the data page, etc.). For example, the processor 112 may compute a correction function to determine the correction data for the data page. In addition or as an alternative, the processor 112 uses the correction data to determine alternative digital values for each uncertain data value in step 615. The alternative digital values for each uncertain data value will often include the nearest adjacent digital value and the next nearest adjacent digital value. It might also include the digital data values two digital data values away from the digital representation of the detected analog voltage of the memory cell. Typically, not every memory cell will have an uncertain data value. In step 620, the processor 112 stores the identified alternative digital values in a buffer along with stored digital data values for memory cells having certain digital data values.

After the alternative digital values are stored, the processor 112 selects, in step 625, a combination of alternative digital values from the buffer. The combination of alternative digital values may itself be selected based on an algorithm that, for example, attempts to identify those alternative digital values more likely to be correct. This selection algorithm may use data relating to a degree of uncertainty associated with each digital data value. Moreover, regardless of whether such a selection algorithm is used, the selected combination of alternative digital values need not include all of the possible alternative digital values. In other words, even among the data values identified as being uncertain, some of the original data values may be used along with some subset of alternative data values.

Next, the processor 112 stores the page data in a buffer using the selected combination of alternative digital values in step 630 along with the digital data values determined with adequate certainty. Then, the processor 112 performs ECC algorithm on the stored page data in step 635. For example, the processor 112 may perform the operations as described in the process 500. In some cases, the execution of an ECC algorithm may result in changes to one or more of the alternative digital values and even to one or more of the digital data values determined with some presumption of certainty. In step 640, the processor 112 determines whether the ECC algorithm is successful. If the processor 112 determines that the ECC algorithm is successful, then, in step 645, the processor 112 stores the page data with the result of the successful ECC and the process 600 ends.

In step 640, if the processor 112 determines that the ECC algorithm is not successful, then, in step 650, the processor 112 determines whether another combination of alternative values is available to try. The number of possible combinations of alternative values will depend upon the number of memory cells with uncertain digital data values and the number of identified alternative digital values. Typically, most of the memory cells will not have uncertain digital data values. If the processor 112 determines another combination of alternative values is available to try, then the process returns to step 625.

If, in step 650, the processor 112 determines that all alternative combinations have been tried, then the processor 112 generates an error message in step 655 and the process 600 ends. In some implementations, it may also be possible to generate additional alternative values and/or to adjust voltage thresholds for reading the various data values and to retry performing the ECC algorithm to identify correct values for the page data. For example, alternative values may be identified for voltage levels that were previously determined to represent a particular value with adequate certainty but that are relatively near a threshold for one of the digital value distribution curves 205-210 (discussed above in regard to FIG. 2A). Alternatively, the voltage thresholds for the various digital value distribution curves 205-210 can be adjusted as discussed above, and the data values can be regenerated, including identifying new alternative values.

In some implementations, the error message in step 655 is recorded in a maintenance log in NVM 154. Then, during a maintenance operation, such as that shown in FIG. 9, it may also be possible to generate additional alternative values and/ or to adjust voltage thresholds for reading the various data values and to retry performing the ECC algorithm to identify correct values for the page data. The identified correct values then may be used to rewrite the data.

Figure 6B:
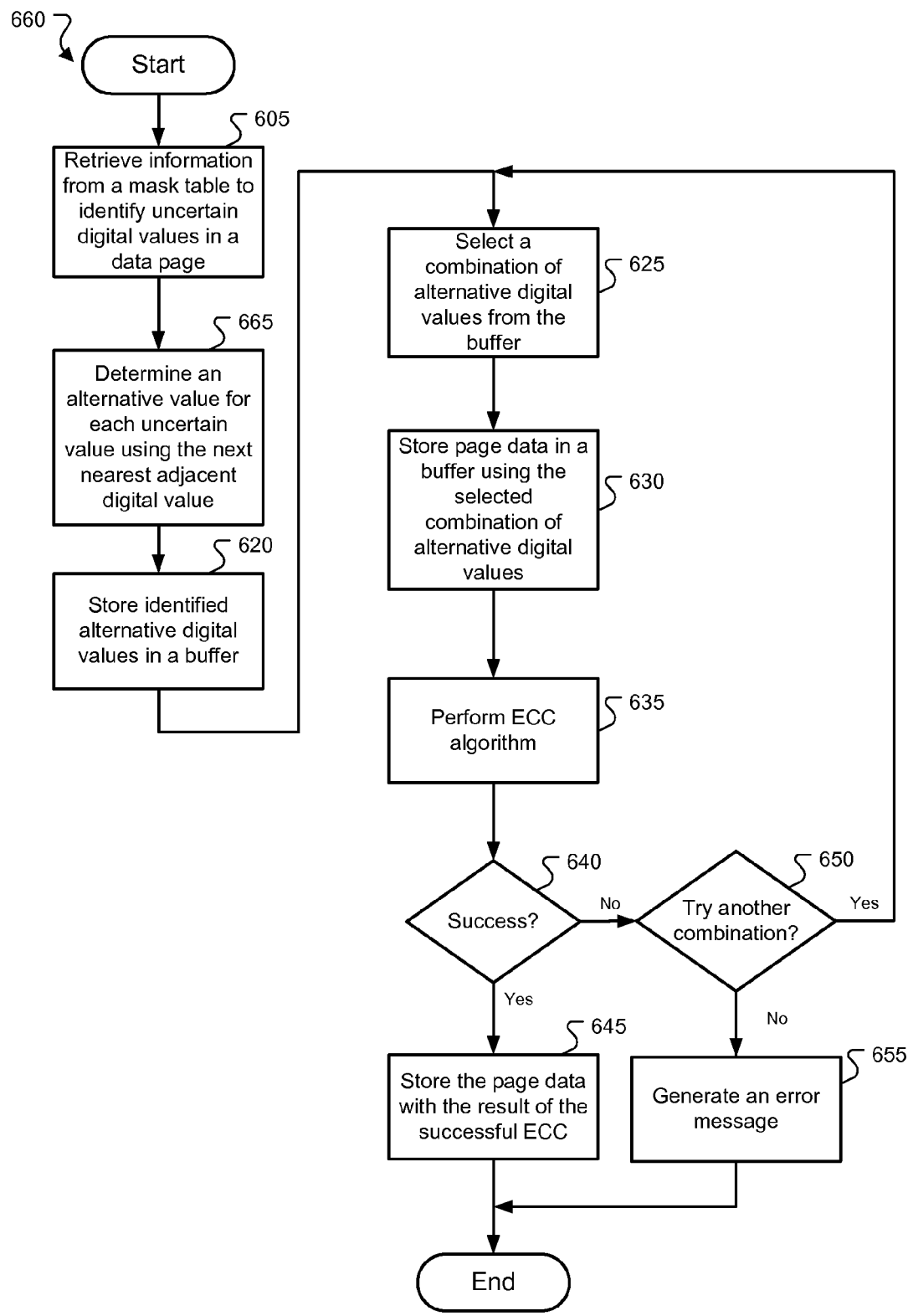

FIG. 6B shows a flow chart that illustrates another example of a process 660 for generating and using alternative values. The process 660 has some steps in common with the process 600. In this example, after identifying uncertain data values through use of a mask table or otherwise at step 605, the processor 112 determines, in step 665, an alternative value for each uncertain value using the nearest adjacent digital value. For example, the processor 112 may use the digital value distribution 200 (FIG. 2A) and select a second nearest adjacent digital value instead of the nearest adjacent digital value to the cell voltage. Then, the processor 112 continues the process 660 by performing operations described in connection with FIG. 6A beginning with step 620.

Figure 6C:
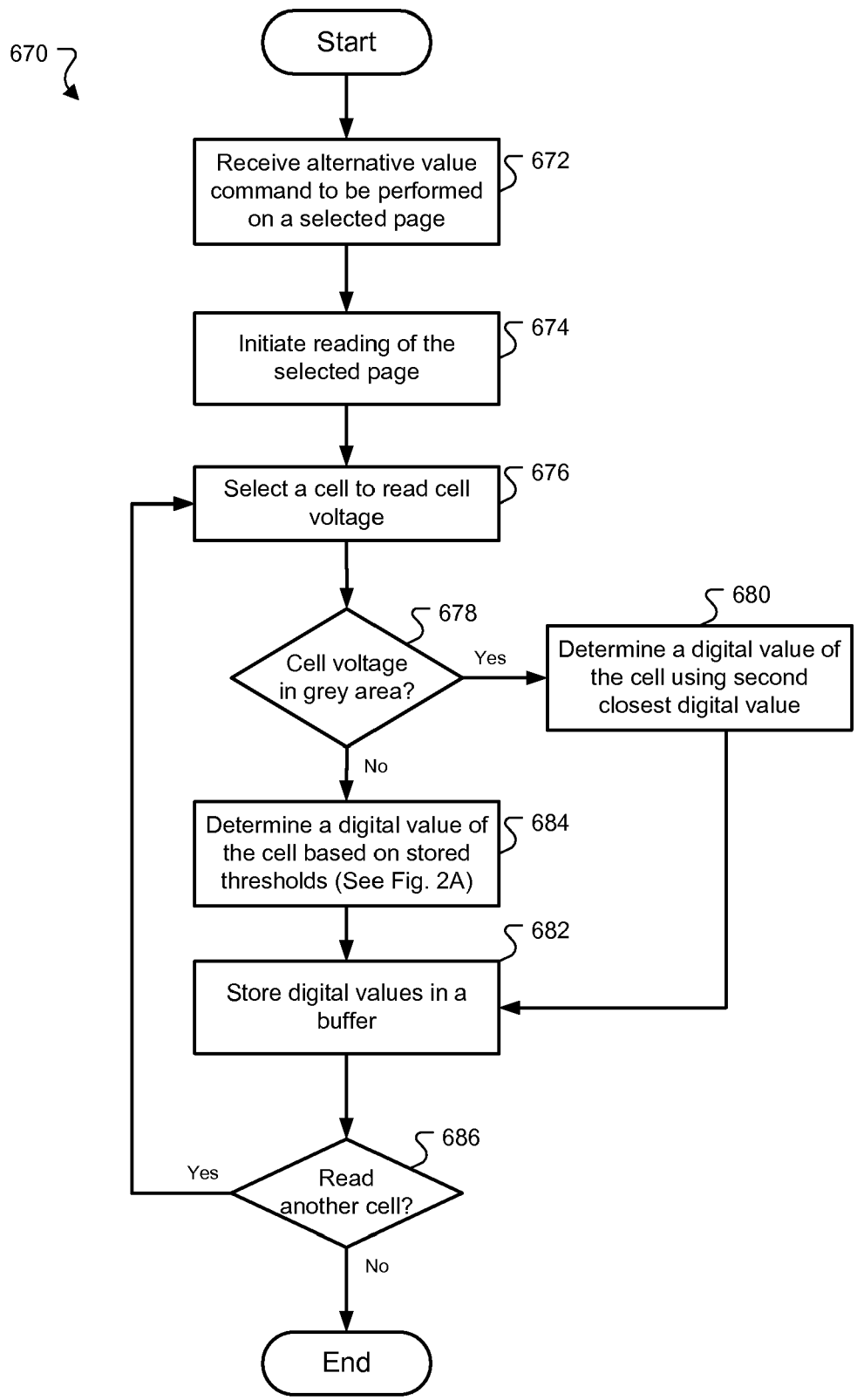

FIG. 6C shows a flow chart that illustrates another example of a process 670 for generating and using alternative values. In this example, the processor 112 does not necessarily retrieve uncertain digital value information from the mask table. The process 670 begins in step 672 when the processor 112 receives a command to perform an alternative value identification and analysis on a selected page (see, e.g., FIG. 5, step 535).

The processor 112 initiates, in step 674, reading of the selected page. In step 676, the processor 112 selects a cell in the page to read a cell voltage. In step 678, the processor 112 determines whether the cell voltage is uncertain. For example, the processor 112 may use the digital value distribution 200 as shown in FIG. 2A to determine whether the received cell voltage is in one of the grey areas 220. If the processor 112 determines that the cell voltage is in the grey area, then the processor 112 determines a digital data value of the cell using a second closest digital data value in step 680. In other implementations, the processor 112 determines a digital data value of the cell using the first closest digital data value. Next, the processor 112 stores, in step 682, the digital data values in a buffer.

If, in step 678, the processor 112 determines that the cell voltage is not in the grey area, then the processor 112 determines a digital data value of the cell based on stored thresholds in step 684 and the processor 112 performs the step 682.

After the step 682, in step 686, the processor 112 determines whether to read another cell in the page. If the processor 112 determines to read another cell, then the process returns to step 676. If the processor 112 determines that there are no further cells to read, then the process 670 ends.

Figure 7A:
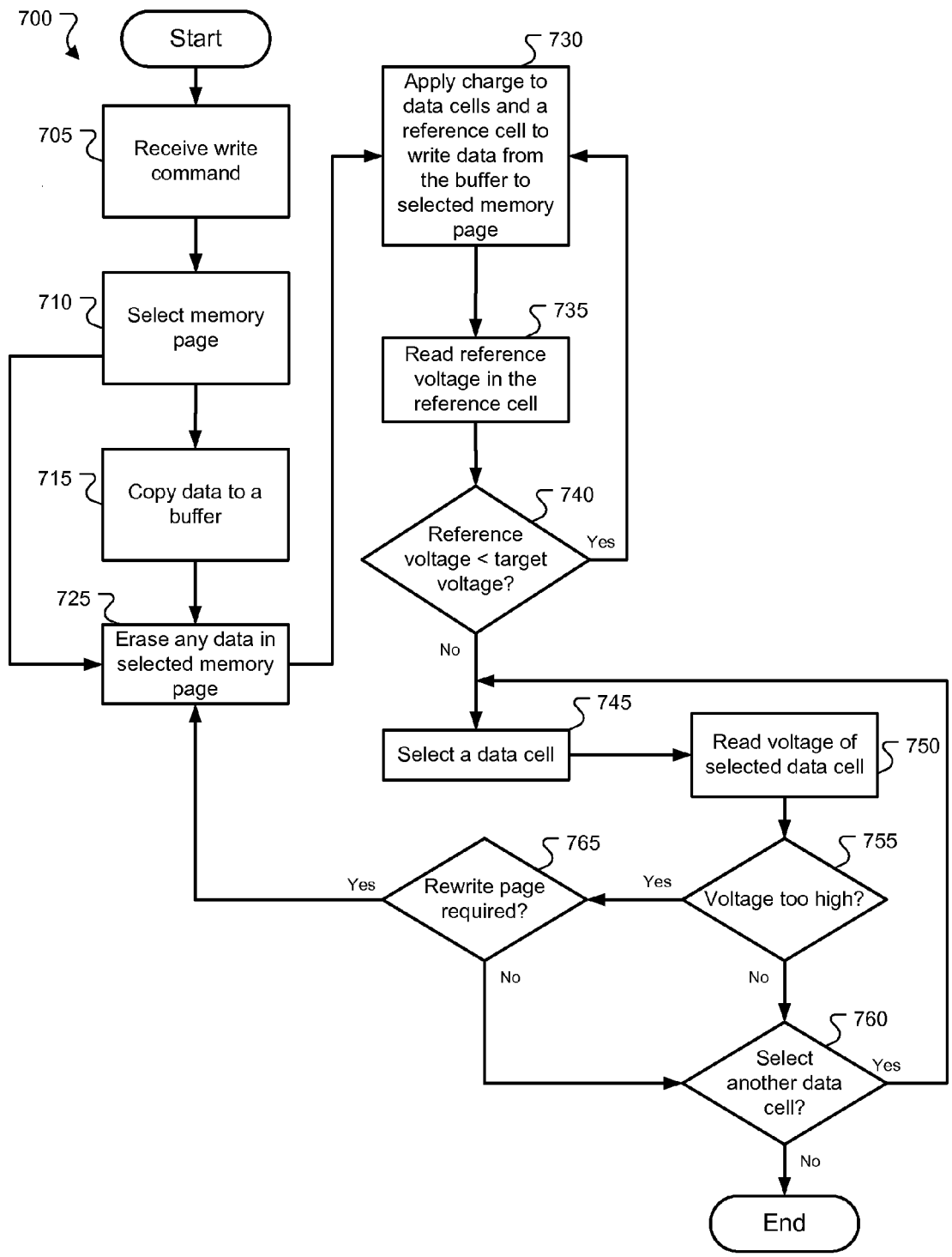
FIGS. 7A-7B show flow charts that illustrates an examples of processes for writing data to a flash memory page.

FIG. 7A shows a flow chart that illustrates an example of a process 700 for writing data to the flash memory page 121 using the reference cells 130a, 130b, 130c. The process 700 may be generally performed by the processor 112. The process 700 begins in step 705 when the processor 112 receives a write command. For example, the write command may include a write instruction, data to be written, and a memory address that the data is going to be written to, which may be received, for example, as a logical block address from the host. Then, based on the write command, the processor 112 selects a memory page in the flash memory in step 710.

Next, the processor 112 may copy, in step 715, the data to be written to a buffer, such as the SDRAM 151. The data may either be transferred from an external host device or from another memory page. In some implementations, the data stored on the selected memory page is copied into the buffer for recopying back into the selected page. In other implementations, the data to be written to a selected memory page is not copied into the buffer, but rather written directly from the data source (either from an external host device or from other memory cells) to the selected memory page.

Then, the processor 112 erases, in step 725, any data stored in the selected page. In step 730, the processor 112 writes the data from the buffer to the selected memory page by, for example, applying charges to the data cells 124 and the reference cell 130c. Step 730 applies different amounts of charge to the memory cells depending on the desired data value and corresponding analog voltage level for each cell. In some implementations, a charge pump may be used to apply charges to memory cells in the selected memory page. Then, the processor 112 reads a reference voltage in the reference cell 130c of the selected page in step 735. The reference voltage is read by detecting a voltage level in the reference cell 130c. The processor 112 checks, in step 740, whether the reference voltage is less than a target voltage. If the processor 112 determines that the reference voltage is less than the target voltage, then the process returns to step 730 to apply additional charge and increase the voltage stored in the cells in the selected memory page. The amount of applied additional charge may be scaled depending upon how the desired voltage level compares percentage-wise to the voltage of the reference cell(s) (e.g., if the detected reference cell voltage is 10% lower than targeted and a particular memory cell should have a voltage level double that of the reference cell, then the amount of additional charge applied to the particular memory cell may be twice that applied to the reference cell).

In step 740, if the processor 112 determines that the reference voltage is not less than the target voltage, then the processor 112, in step 745, selects a data cell and reads voltage of the selected data cell in step 750. Then, in step 755, the processor 112 determines whether the read voltage is too high. For example, the processor 112 may compare the read cell voltage to the digital value distribution and check whether the cell voltage lies within a voltage range of the targeted digital value. If the processor 112 determines that the voltage is not too high, then the processor determines, in step 760, whether to select another data cell. If the processor 112 determines that it is not necessary to select another data cell, then the process 700 ends. Otherwise, the process 700 returns to step 745 to test an additional data cell.

In some implementations, it may also be possible to test the data cells selected at step 745 to determine if they are too low. If so, the process 700 may return to step 730 to apply additional charge to one or more of the data cells. In some implementations, once the testing of one or more reference cells at step 740 is complete, the voltage level of all data cells may be selected at step 745 (or in iterative repetitions of step 745) to determine if the levels are too high and/or too low. In this manner, the reference cells may be used to perform an initial charging of the page or block, followed by testing and possible tweaking of voltage levels in the cells. Furthermore, in some implementations, the target voltages for reference cells used at step 740 may be set a little lower than the threshold voltage for a desired data value to attempt to avoid overcharging, followed by checking actual data cell values and tweaking the voltage levels to reach voltage levels corresponding to the desired data values for the actual data cell If, in step 755, the processor 112 determines that the voltage is too high, then the processor 112 determines whether it is necessary to rewrite the selected page. For example, the processor 112 may compare the number of bit errors to a threshold that is less than or equal to the number of correctable errors using one of the correction algorithms described with reference to FIG. 5. If the number of bit errors is greater than the threshold, then the selected page is re-written. Otherwise, the processor 112 may determine that a rewrite of the selected page is not required. In step 765, if the processor 112 determines that rewrite of the page is not required, then the process 700 continues with step 760. If the processor 112 determines that rewrite of the page is required in step 765, then the process 700 returns to step 725 to reinitiate writing of the memory page. In some implementations, the target voltage may be decreased incrementally after step 765 to reduce the likelihood of overshooting the target voltage.

Figure 7B:
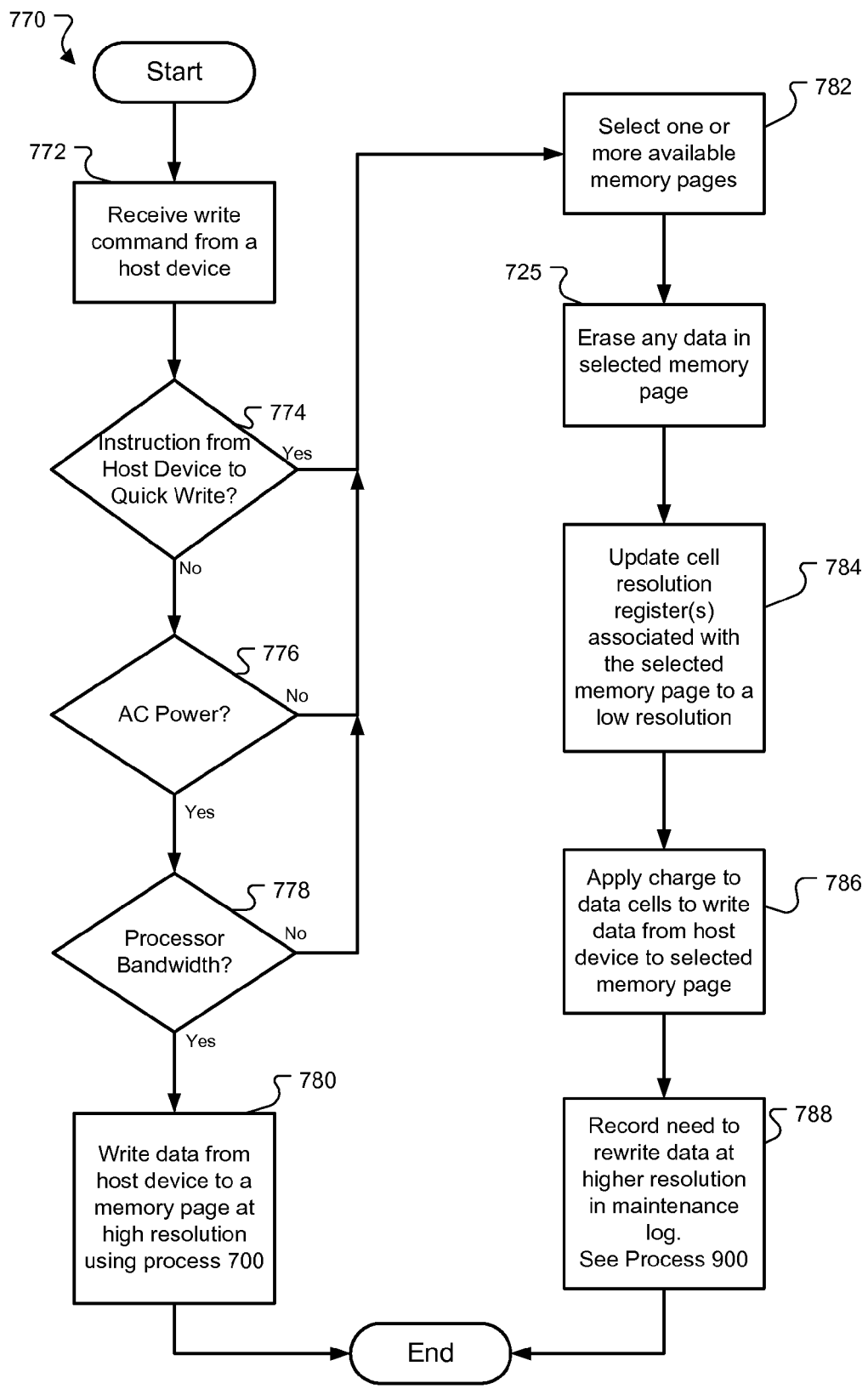

FIG. 7B shows a flow chart illustrating an example of a process 770 that achieves a higher data transfer rate between a host device and the MCP 100. The process 770 begins in step 772 when the processor 112 receives a write command from a host device. For example, the write command from a host device may include a write instruction, data to be written, and a memory address that the data is going to be written to, which may be received, for example, as a logical block address from the host.

Next, the processor 112 determines whether to proceed to a quick write process (e.g., writing at a single level cell resolution or other relatively low resolution) or to use a more time, power, and processor intensive writing process of writing at a higher resolution. In step 774, the processor 112 determines if there is a command from a host interface to perform a quick write. In some implementations, a host device may also specify the resolution of the quick write. If a host device does not specify a quick write, then the processor 112 may independently determine if a whether a quick write is warranted. Step 776 then determines if the MCP 100 or the host device connected to the MCP 100 meets a predetermined power supply conditions. In the shown implementation, step 776 determines whether the host device is supplied with AC power. In other implementations, step 776 instead determines if a battery supplying power to the host device is charged to a predetermined charge. In some implementations, step 776 will determine whether a battery supplying charge to the host device is charged to maximum capacity or at least 90% of capacity. Step 778 then determines whether the processor 112 has excess bandwidth meeting a predetermined bandwidth condition. In some implementations, step 778 is satisfied if the processor 112 is otherwise idle. In other implementations, step 778 is satisfied if a predetermined percentage of bandwidth of the processor 112 be unused. If both 776 and 778 are satisfied, then the process uses process 700 to write to memory cells at a high resolution, step 780. If one or both of conditions 776 and 778 are unsatisfied, then the process proceeds to a quick write procedure.

In a quick write procedure, the processor 112 in step 782, selects one or more available memory cell pages to write data from the host device to. In some implementations, the processor may copy data from the host device into a buffer, such as the SDRAM 151. In other implementations, data from the host device is not copied into the buffer, but rather written directly to the selected memory page in step 786 after steps 725 and 784. In step 725, the processor erases any data stored in the selected page(s). In step 774, the processor 112 updates any cell resolution registers associated with the selected memory page(s) to a low resolution. In some implementations, the low resolution will be a resolution of one bit per memory cell. In other implementations, the low resolution will be 2, 3, or 4 bits per cell. Writing at a lower resolution when copying data from a host device to the MCP 100 increases the data transfer rate because less precision is needed when charging each memory cell and, thus, the degree of care and the amount of voltage adjustments needed when writing to the memory cells can be reduced. After writing the data to the memory cell(s) at a low resolution, step 784 will record a maintenance log entry indicating that the data stored in the selected memory page should be rewritten at a higher resolution during a maintenance process (process 900).

Figure 8A:
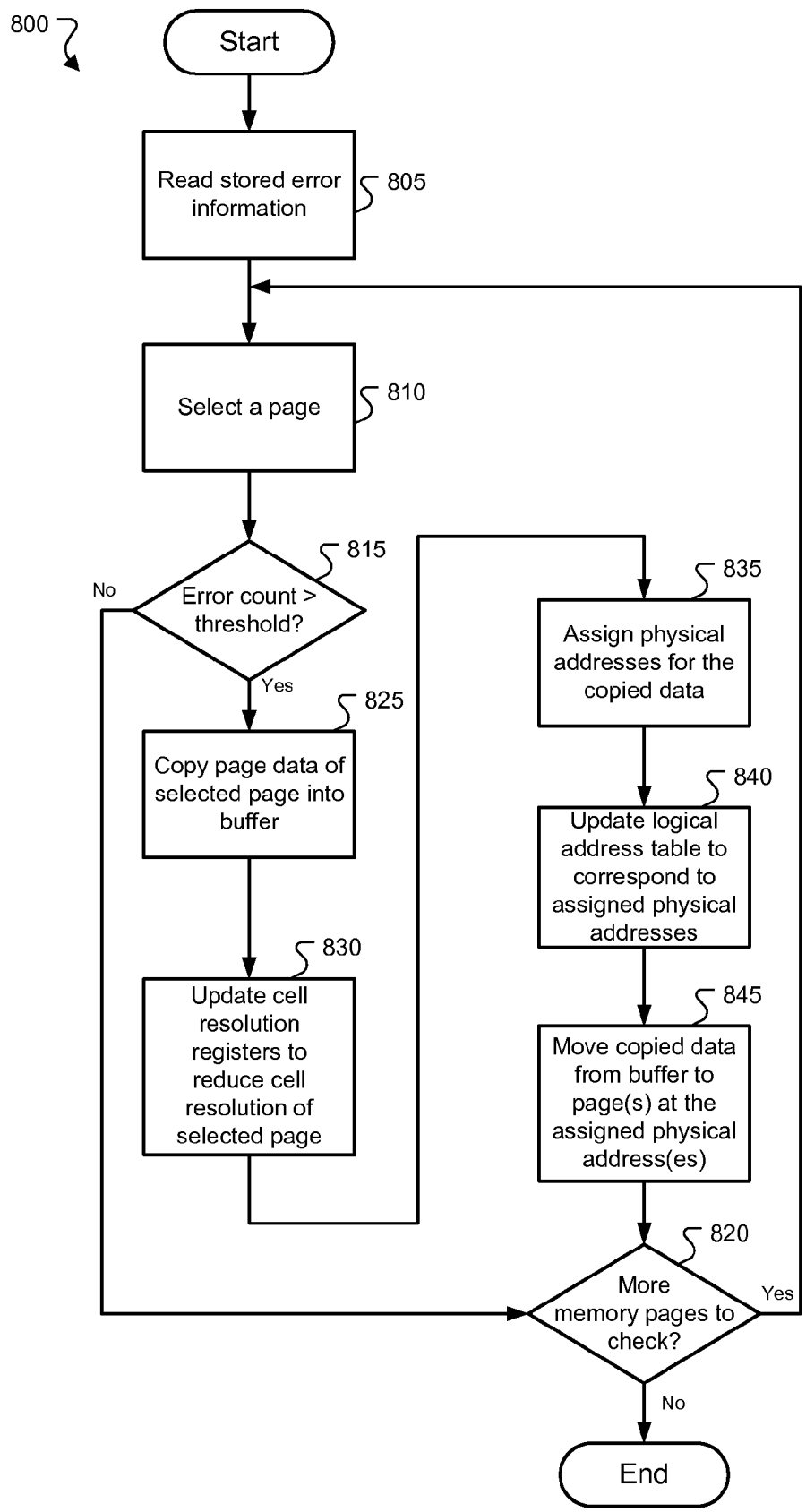
FIGS. 8A-8B show flow charts illustrating examples of processes for adjusting cell resolution of a memory page.

FIG. 8A shows a flow chart illustrating an example of a process 800 for adjusting a cell resolution of a memory page. The process 800 may perform the operations in the process 800 when, for example, the processor 112 executes a maintenance program to update the cell resolution registers 166. The process 800 begins in step 805 when the processor 112 reads stored error information in step 805. The error information may be stored during read errors or write errors, for example, as described at step 480 in FIG. 4. Next, the processor 112 selects a page in step 810. In step 815, the processor 112 determines whether the error count of the selected page is greater than a threshold. If the error count of the selected page is not greater than the threshold, then the processor 112 checks whether there are more pages to check in step 820. If the processor 112 determines that there are no more pages to check, then the process 800 ends. If, in step 820, the processor 112 determines that there are more pages to check, then the process returns to step 810. In some implementations, the processor 112 may check all the memory pages with errors. In other implementations, the processor 112 may only check memory pages with new errors recorded in the error information.

In step 815, if the error count of the selected page is greater than the threshold, then the processor 112 copies a page of data from the selected page into a buffer in step 825. Next, the processor 112 updates the cell resolution registers 166 to reduce the cell resolution of the selected page. For example, the flash interface 115 may check the cell resolution registers 166 to find that the cell resolution is reduced and the flash interface 115 may then read and write to the selected page using the new reduced cell resolution.

Then, the processor 112 can assign physical addresses for the copied data in step 835. Depending on available memory pages, the processor 112 may assign one, two, four, or other number of physical memory pages to store the copied data. Next, the processor 112 updates in step 840 a logical address table to correspond to the assigned physical addresses. The logical address table may be used to map a logical page to one or more physical pages. An example use of the logical address table during a memory access operation is described with reference to FIG. 10. In step 845, the processor 112 moves the copied data from the buffer to the pages at the assigned physical addresses. Next, the processor 112 determines whether there are more pages to check in step 820. If so, the process 800 returns to step 810. Otherwise, the process 800 ends.

Figure 8B:
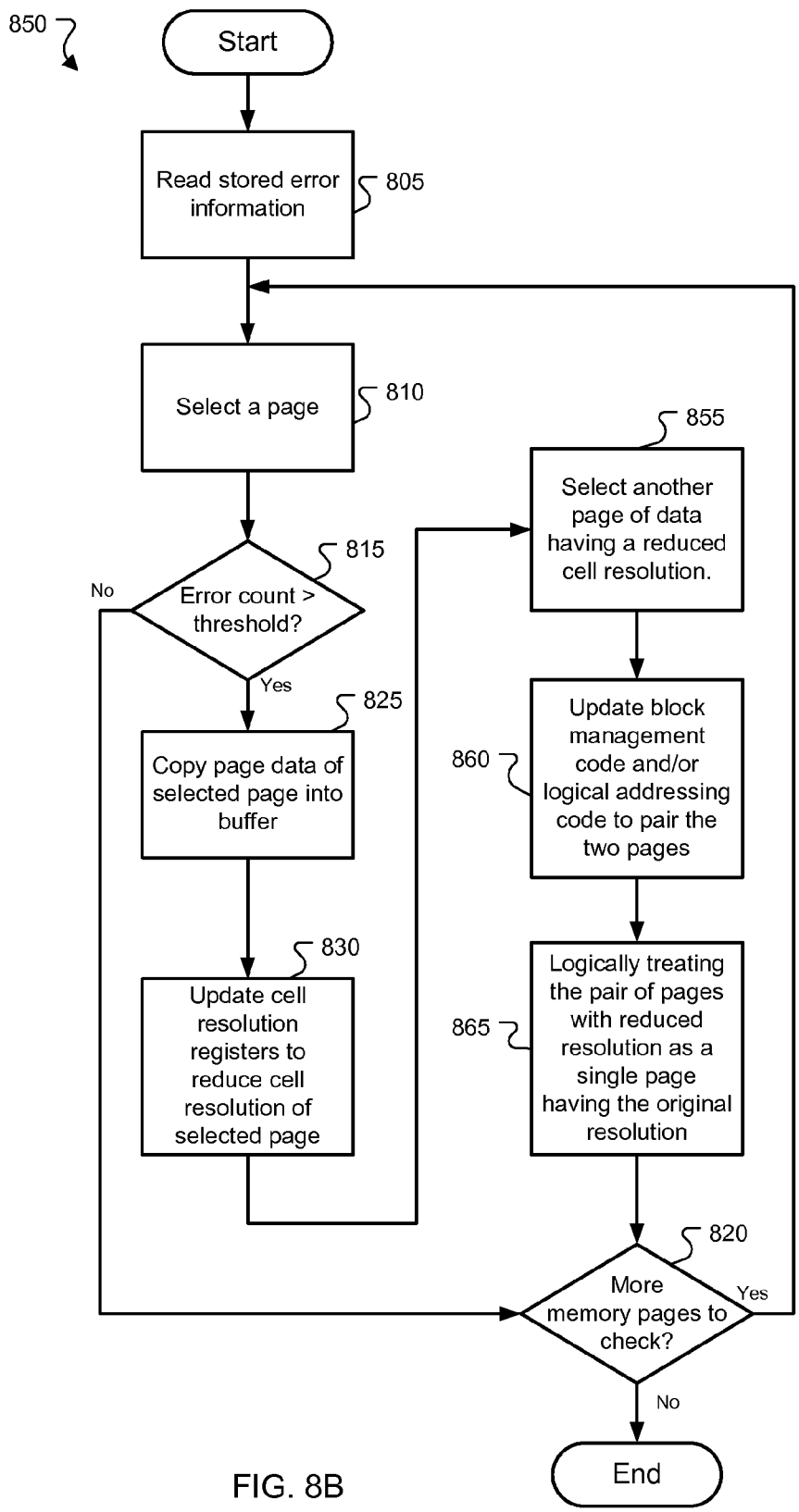

FIG. 8B depicts a similar process to that in FIG. 8A that is focused on downgrading groups of pages or blocks of memory cells and logically treating the group as a single page or block of memory cells having the original resolution. In FIG. 8B the process 860 also reads stored error information 805, selects a page 810, and determines whether an error count associated with the page is in excess of a threshold 815. If the error count associated with the page is in excess of a threshold, then the data stored in the page is copied to a buffer 825 and the cell resolution register(s) associated with the page are updated to reduce the resolution of the page 830. In the implementation depicted in FIG. 8B, however, a processor also selects another page of data having a reduced cell resolution 855 and updates the block management code and/or the logical addressing code to pair the two pages together. The two pages having reduced cell resolution are then logically treated as a single page with the higher original resolution. This process may group together more than two pages of memory cells.

In some implementations, this process will downgrade entire blocks of memory cells and pair or otherwise associate them. In some implementations, each paired page will have the same downwardly adjusted cell resolution and include the same number of memory cells. For example, a page of memory cells downgraded from each memory cell storing 8 bits of data to each memory cell storing 4 bits of data is grouped with another page of memory cells with each memory cell storing 4 bits of data. The combination of these two pages of memory cells is then logically treated by the flash disk controller as a single page (or as a single block) storing 8 bits of data per memory cell. These paired pages of memory cells need not be on the same block and could possibly be on different flash memory dies. The process 860 next performs step 820 of determining whether there are more memory pages to check and proceeds in the same manner as described in FIG. 8A.

FIG. 9 is a flow chart that illustrates a maintenance process 900. One possible function for maintenance process 900 is for rewriting, at a relatively high resolution, data stored in a flash memory at a relatively low resolution (e.g., see FIG. 7B). The maintenance process can be used, for example, to maximize the battery life of a host device while also maximizing data storage capacity. In some implementations, maintenance process 900 is triggered by the processor as part of a routinely scheduled maintenance operation. In some implementations, maintenance process 900 is triggered by a signal from a host device signaling that the host device is supplied with AC power. In other implementations, other conditions may cause a host device or the processor 112 to trigger the maintenance process 900, such as, an idle processor 112.

Process 900 begins with step 905, which may determine whether the MCP 100 is operating under a predetermined power condition. In some implementations, this power condition is met by a host device receiving AC power. In some implementations, this power condition is met by a host device battery meeting a predetermined amount of charge, for example, the battery being fully charged. A fully charged battery may indicate that a host device is being supplied with AC power. If the MCP 100 does not meet the predetermined power condition, process 900 ends.

Next, in step 910, the processor 112 may determine whether the processor 112 has sufficient bandwidth to fully perform the maintenance process 900. In some implementations, the maintenance operation merely runs as a background process which requires minimal bandwidth. In some implementations, the maintenance operation requires an idle processor 112. In other implementations, process 900 does not determine whether the processor 112 has sufficient bandwidth. In some implementations, the bandwidth requirement changes based upon the need for the maintenance operations, which may be measured by the time between successful maintenance processes or by the amount of available space on the flash memory. If the processor 112 does not have sufficient bandwidth, process 900 ends.

If the predetermined power condition is met and the processor 112 has sufficient bandwidth, process 900 then may read stored maintenance logs, step 915. In some implementations, the stored maintenance logs are stored in NVM 154. In some implementations, stored maintenance logs indicate the priority of possible maintenance operations. In some implementations, the stored maintenance logs are used to determine whether any maintenance steps (such as steps 920, 925, 930 & 935) can be performed in a simplified operation. For example, maintenance logs may indicate the need to both downgrade a particular page of memory cells and to rewrite the data on the same page of memory cells. In other implementations, the maintenance operations are a predetermined sequence of, for example, rewriting transferred data at a higher resolution (step 920); downwardly adjusting cell resolutions and pairing groups of pages, e.g., by performing processes 800 and 850 (step 925); rewriting data that meet a predetermined error condition (e.g., using process 700) (step 930); swapping the most frequently accessed data with the least frequently used data using the wear management software code 157 (step 935); updating the logical addressing software code 163 for each maintenance operation that moved data from one physical location to another physical location (e.g., using process 1000), (step 940); and refreshing pages of data that exceed a threshold amount of voltage sag by applying additional charge to the page of memory cells (step 945). Other sequences including some, all, or additional operations may also be used. In some implementations, the process 900 repeats step 905 and/or step 910 between each maintenance step 920, 925, 930, 935, or 945, and may end if either of condition 905 or 910 change. Process 900 then ends.

Figure 10:
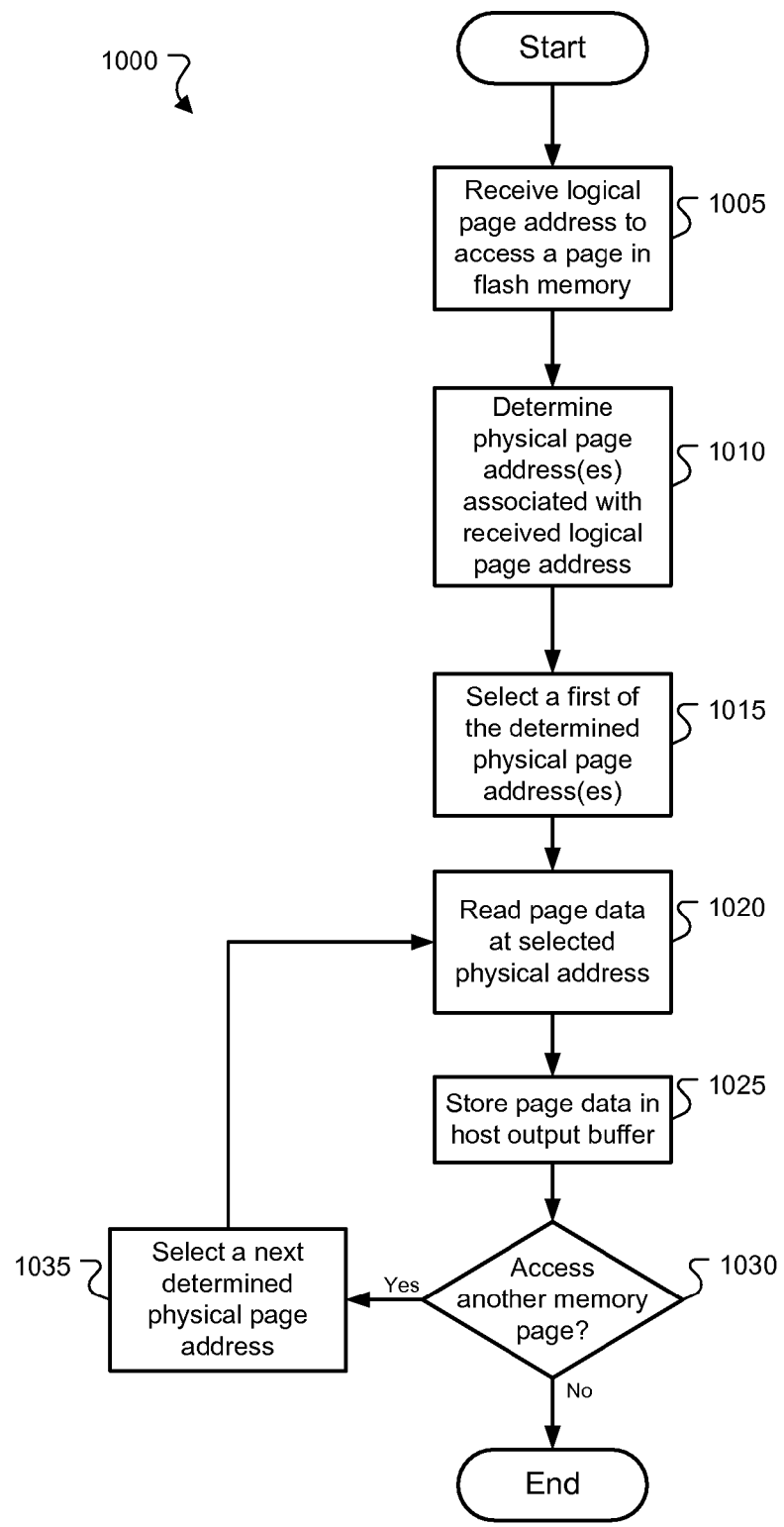
FIG. 10 shows a flow chart illustrating an example of a process of logical addressing in the flash disk controller.

FIG. 10 is a flow chart that illustrates an example of a process 1000 of logical addressing in the FDC 106. For example, the FDC 106 may map a received read or write command with a logical address to one or more physical pages. In some implementations, the FDC 106 may dynamically map a logical page to one or more variable physical page(s). For example, the FDC 106 may change the mapping to balance the load of a physical memory page. In some implementations, the mapping between logical pages and physical pages may be stored in a logical address table. In some implementations, the process 1000 may be performed by the processor 112 when the processor 112 is executing the logical addressing code 163. The process 1000 begins when the FDC receives a command from the host device that a memory page is to be accessed (e.g., read, written to, or erased). Then, in step 1005, the processor 112 receives a logical page address to access a page in the flash memory.

Next, the processor 112 determines, in step 1010, one or more physical page addresses associated with the received logical address. In one example, the received logical page address may be associated to only one physical page address. In another example, the received logical page address may be associated with two or more physical pages because the physical pages have a lower cell resolution than normal, or the physical pages are not contiguous in the flash memory, or they are in different blocks or on different dies.

Then the processor 112 selects a first of the determined physical page addresses in step 1015. In step 1020, the processor 112 reads the page data at the selected physical address. The processor 112 then stores, in step 1025, the page data in the host output buffer. In step 1030, the processor 112 determines whether it is necessary to access another memory page. For example, if there is more than one physical page addresses associated with the logical page address, then the processor 112 may access another memory page. If, in step 1030, the processor 112 determines that it is necessary to access another memory page, then the processor, in step 1035, selects a next determined physical page address and the process returns to step 1020. Otherwise, the process 1000 ends.

Figure 11:
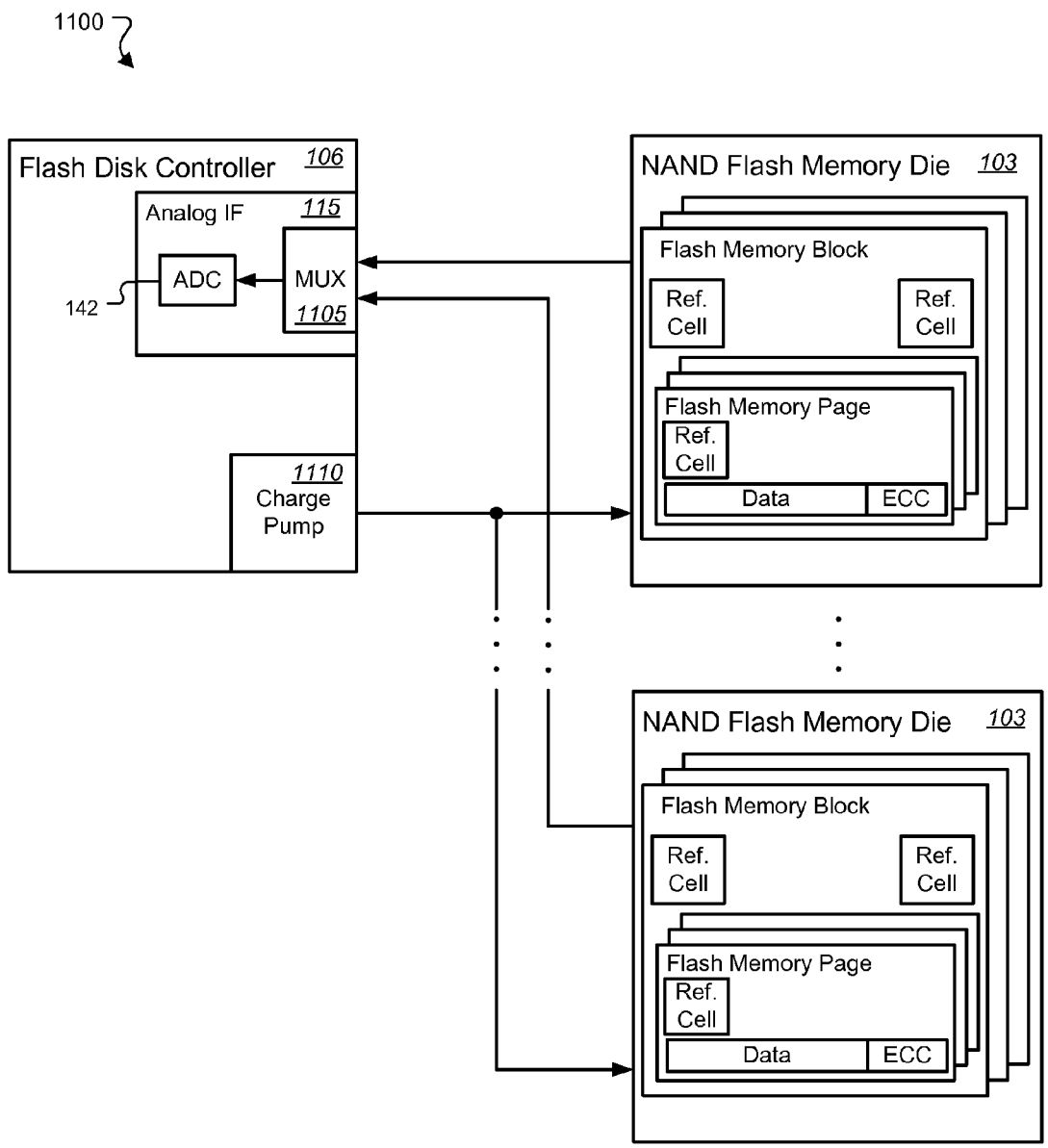
FIG. 11 shows an example of a system that includes a charge pump and an analog to digital converter external to the NAND flash memory die.

FIG. 11 shows an example system 1100 that includes multiple NAND flash memory dies 103 and the FDC 106. The FDC 106 includes a multiplexer (MUX) 1105 in the analog interface 115 and a charge pump 1110. Although the system 1100 is shown using NAND flash memory dies 103, some of the techniques used in the system 1100 may also be applicable to NOR flash memory dies, or a combination of NAND and NOR dies. The system 1100 may be implemented using discrete ICs, or it may be partially or fully integrated in a single package.

The FDC 106 receives analog data from the NAND flash memory dies 103 through the analog interface 115. In this example, the MUX 1105 receives multiple analog inputs. In some implementations, the MUX 1105 receives the multiple analog inputs from multiple flash memory dies 103. The analog interface 115 can control the MUX 1105 to select one analog input to be transmitted to the ADC 142. For example, the analog interface 115 may control the MUX 1105 based on a received read command. During a write operation, the FDC 106 uses the charge pump 1110 to apply charges to the memory cells in one of the NAND flash memory dies 103. In some implementations, the charge pump 1110 is adapted to supply charge to memory cells on a plurality of flash memory dies 103. For example, the FDC 106 may send a control signal to select a designated memory die to receive charges from the charge pump 1110. Then, when the charge pump 1110 applies charges, the selected memory die receives the charges.

By sharing the ADC 1105 and the charge pump 1110 between multiple dies 103, the storage size of the memory dies 103 may be increased. Additionally, the flash memory dies 103 may be manufactured with a lower cost without the ADC 142 and the charge pump 1110. In some implementations, the charge pump 1110 may be integrated on a die with the FDC 106 or separately mounted on a different die or on a different substrate, such as a printed circuit board.

In order to facilitate the use of an ADC 1105 and a charge pump 1110 adapted to be used with multiple flash memory dies 103, some flash memory dies 103 may include an input adapted to receive a programming charge from an external supply node. The flash memory dies 103 are then not required to include any additional circuitry to alter or regulate the supplied programming charge. The flash memory dies 103 may also include an output adapted to send an analog voltage signal to a flash disk controller 106.

In some implementations, the FDC 106 may also include a charge pump interleaving method to write data to the memory dies 103.

Figure 12:
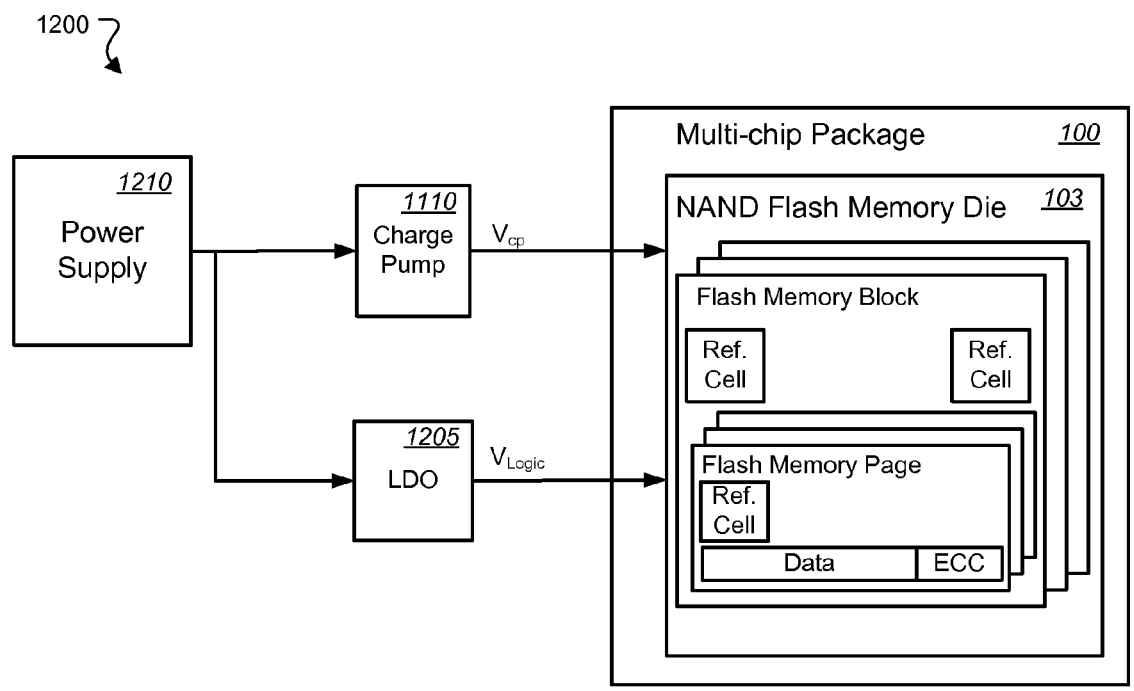
FIG. 12 shows an example of a system that includes decoupled power input at a NAND flash memory die.

FIG. 12 shows an example system 1200 illustrating an architecture to separately provide programming and logic-level power to the NAND flash memory die 103. The system 1200 includes the charge pump 1110 and a low dropout regulator (LDO) 1205 that receive electrical power from a power supply 1210.

As shown, the NAND flash memory die 103 includes two power inputs. A power input for charge pump voltage ($V_{cp}$) and a power input for logic voltage ($V_{logic}$). In some examples, the $V_{cp}$ may be substantially higher than the $V_{logic}$. For example, the $V_{cp}$ may be approximately 12-20 V or approximately 12-30 V and the $V_{logic}$ maybe approximately 1-3 V. In some implementations, the regulation and current requirements for the $V_{cp}$ may be substantially different from those for the $V_{logic}$.

As an example, the NAND flash memory die 103 may require that the $V_{logic}$ to have a tightly regulated (e.g., 0.5%, 1.0%, 5%) voltage tolerance at a low logic voltage to minimize power consumption, switching times, etc. Furthermore, the logic voltage may call for high frequency bypass capacitance at a low voltage level. In contrast, the charge pump supply regulation requirements may be between about 5% and 10%, with a need for substantially low frequency, higher voltage capacitance.

In order to facilitate the system of FIG. 12, the flash memory die 103 may include a first interface for receiving power for selectively programming each flash memory cell, and a second interface for receiving power supplied to logic level circuitry to perform the selection of flash memory cells to be supplied with power from the first input during a write operation. The flash disk controller 106 may comprise a first power source for supplying power to the first interface at a programming voltage and a second power source for supplying logic-level power to the second interface. The first and second power sources may be external to the flash memory die 103.

Although various implementations of processes and techniques have been described, other implementations may perform the steps in different sequence, or a modified arrangement to achieve the same primary function. In addition, although operations in the various processes are sometimes described as being performed by a particular device or component, such devices or components are merely examples, and the operations can be performed using alternative devices or components in some implementation In some examples, the NAND flash memory die 103 may also have any practical number of bits of resolution, such as, for example, 6, 7, 10, 12 bits of resolution. Various implementations may be used to perform ECC operations with flash memory that may include NAND flash memory, NOR flash memory, or a combination of these or other non-volatile memories. Flash memory die of one or more types may be stacked and/or mounted adjacent each other in the MCP 100. Those of ordinary skill in the art will recognize that some examples of techniques described herein may be applied to particular advantage with NAND flash technology, and some methods described herein may be generally applicable to non-volatile memories such as NAND and/or NOR flash.

Although an example of a system, which may be portable, has been described with reference to the above figures, other implementations may be deployed in other processing applications, such as desktop and networked installations.

Although particular features of an architecture have been described, other features may be incorporated to improve performance. For example, caching (e.g., L1,L2, etc. . . . ) techniques may be used in the FDC 106. Random access memory may be included, for example, to provide scratch pad memory and or to load executable code or parameter information stored in the flash memory for use during runtime operations. Other hardware and software may be provided to perform operations, such as network or other communications using one or more protocols, wireless (e.g., infrared) communications, stored operational energy and power supplies (e.g., batteries), switching and/or linear power supply circuits, software maintenance (e.g., self-test, upgrades, etc. . . . ), and the like. One or more communication interfaces may be provided in support of data storage and related operations.

In some implementations, one or a combination of methods may be used to improve data integrity. For example, cell voltage errors may be addressed by adjusting thresholds and/or rewriting cells at least once. Cell re-writing may be performed in response to deviations from ideal cell voltage and/or as a background activity. For example, multi-level cell voltages may be rewritten to refresh the voltage in one or more lossy cells in a page. For cells that have been characterized as tending to lose voltage over time, the voltage level to which such cells are charged may be boosted to near an upper threshold of each cell's range to compensate for anticipated loss of charge in those cells over time. The boosted voltage level may initially be near or above the upper threshold of the intended range, which may be in a gray zone between ranges. Based on estimated or determined loss rates, the data may be re-written frequently enough to substantially maintain the cell voltages within a desired range. Similar compensation may be used to compensate for cells characterized as having an upward drift. Such rewriting procedures may be performed, for example, as a low priority background process that is executed as resources are available. For data identified as high value data, rewriting may be scheduled to occur frequently enough to maintain the cell voltages within a desired range, the frequency being based on an expected voltage drift rate and the size of the voltage range associated with each bit level. In some implementations, rewriting may be configured to be performed more frequently when a portable device is coupled to an external power source, such as a power source derived from the electric utility grid. Rewriting operations may be performed in response to being coupled to such a power source. In addition, rewriting may be configured to be performed less frequently under certain conditions, such as, for example, while in a power conservation mode, during a low battery condition, or when storing short duration or non-critical data (e.g., streaming audio/video).

Some systems may be implemented as a computer system that can be used with implementations of the invention. For example, various implementations may include digital and/or analog circuitry, computer hardware, firmware, software, or combinations thereof. Apparatus can be implemented in a computer program product tangibly embodied in an information carrier, e.g., in a machine-readable storage device or in a propagated signal, for execution by a programmable processor; and methods can be performed by a programmable processor executing a program of instructions to perform functions of the invention by operating on input data and generating an output. The invention can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, each system 100 may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. The invention may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various implementations, the system 100 may communicate using suitable communication methods, equipment, and techniques. For example, the system 100 may communicate with compatible devices (e.g., devices capable of transferring data to and/or from the system 100) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described.

What is claimed is:

1. A system for storing data, the system comprising:
   a plurality of flash memory dies, each flash memory die comprising
   a plurality of flash memory cells;
   a charge pump adapted to supply charge at a predetermined voltage to each flash memory die of the plurality of flash memory dies;
   an interface adapted to receive instructions for controlling the charge pump;
   wherein the charge pump is located on a controller die that includes a flash disk controller; and wherein the controller die is separate from the plurality of flash memory dies.

2. The system of claim 1, wherein the charge pump is located on a printed circuit board.

3. The system of claim 1, wherein the charge pump is located on a die including an analog-to-digital converter.

4. The system of claim 1, further comprising:
   an analog interface electrically connected to the plurality of flash memory dies to detect analog voltage signals from the memory cells on each flash memory die.

5. The system of claim 4, further comprising a controller die that includes the analog interface and the charge pump.

6. The system of claim 5, the controller die further including a flash disk controller.

7. The system of claim 5, the analog interface further comprising:
   an analog-to-digital converter to convert detected analog voltage signals from the flash memory cells into digital representations of the analog voltage signals.

8. The system of claim 4, the analog interface further comprising:
   a multiplexer to receive multiple analog voltage signals.

9. The system of claim 1, wherein the charge pump supplies a voltage of between approximately 12 and 30 volts.

10. The system of claim 1, further comprising:
    a host device adapted to control the charge pump by sending instructions via the interface.

11. The system of claim 10, wherein the host device modifies the instructions for controlling the charge pump based upon a detected temperature.

12. The system of claim 1, wherein the host device is adapted to turn off charge pump power to one or more of the plurality of flash memory dies.

13. The system of claim 1, wherein the system is adapted to turn off power from the charge pump to one or more of the plurality of flash memory dies.

14. The system of claim 1, wherein the plurality of flash memory cells comprise NAND flash memory cells.

15. The system of claim 1, wherein the flash disk controller is configured to select, using a control signal, a specified one of the plurality of flash memory dies to receive charge from the charge pump during a write operation.

* * * * *

UNITED STATES PATENT AND TRADEMARK OFFICE
CERTIFICATE OF CORRECTION

| | | |
|---|---|---|
| PATENT NO. | : 8,000,134 B2 | Page 1 of 1 |
| APPLICATION NO. | : 11/694799 | |
| DATED | : August 16, 2011 | |
| INVENTOR(S) | : Cornwell et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 857 days.

Signed and Sealed this
Fourteenth Day of February, 2012

David J. Kappos
*Director of the United States Patent and Trademark Office*